United States Patent
Sneh

(10) Patent No.: US 7,608,539 B2
(45) Date of Patent: Oct. 27, 2009

(54) ALD METHOD AND APPARATUS

(75) Inventor: Ofer Sneh, Broomfield, CO (US)

(73) Assignee: Sundew Technologies, LLC, Broomfield, CO (US)

( * ) Notice: Subject to any disclaimer, the term of this patent is extended or adjusted under 35 U.S.C. 154(b) by 50 days.

(21) Appl. No.: 11/820,460

(22) Filed: Jun. 18, 2007

(65) Prior Publication Data

US 2007/0243325 A1    Oct. 18, 2007

Related U.S. Application Data

(62) Division of application No. 10/384,504, filed on Mar. 7, 2003, now Pat. No. 7,250,083.

(60) Provisional application No. 60/362,870, filed on Mar. 8, 2002.

(51) Int. Cl.
*H01L 21/02* (2006.01)

(52) U.S. Cl. .................. 438/681; 438/694; 438/695; 438/706; 117/84; 117/88; 117/89; 117/91; 117/93; 117/99; 117/102; 117/105; 427/299; 427/301

(58) Field of Classification Search .......... 117/84, 117/88, 89, 91, 93, 99, 102, 105; 427/299, 427/301; 438/689, 694, 695, 706
See application file for complete search history.

(56) References Cited

U.S. PATENT DOCUMENTS

| 4,058,430 A | 11/1977 | Suntola et al. |
| 4,113,514 A | 9/1978 | Pankove et al. |
| 4,389,973 A | 6/1983 | Suntola et al. |
| 4,413,022 A | 11/1983 | Suntola et al. |
| 4,767,494 A | 8/1988 | Kobayashi et al. |
| 4,993,357 A | 2/1991 | Scholz et al. |
| 5,089,441 A | 2/1992 | Moslehi |
| 5,225,366 A | 7/1993 | Yoder |
| 5,281,274 A | 1/1994 | Yoder |
| 5,483,919 A | 1/1996 | Yokoyama et al. |
| 5,711,811 A | 1/1998 | Suntola et al. |
| 5,855,680 A | 1/1999 | Soininen et al. |
| 5,916,365 A | 6/1999 | Sherman |
| 5,994,240 A | 11/1999 | Thakur |
| 6,007,671 A | 12/1999 | Fujimura et al. |
| 6,015,590 A | 1/2000 | Suntola et al. |
| 6,090,442 A | 7/2000 | Klaus et al. |

(Continued)

OTHER PUBLICATIONS

Klaus et al.; "Atomic layer deposition of $SiO_2$ at room temperature using $NL_3$-catalyzed sequential surface reactions"; Surface Science; Feb. 20, 2000; pp. 81-90; vol. 447; Elsevier Science B.V., The Netherlands.

*Primary Examiner*—Michael Kornakov
*Assistant Examiner*—Matthew J Song
(74) *Attorney, Agent, or Firm*—Patton Boggs LLP

(57) ABSTRACT

A method and an apparatus for executing efficient and cost-effective Atomic Layer Deposition (ALD) at low temperatures are presented. ALD films such as oxides and nitrides are produced at low temperatures under controllable and mild oxidizing conditions over substrates and devices that are moisture- and oxygen-sensitive. ALD films, such as oxides, nitrides, semiconductors and metals, are efficiently and cost-effectively deposited from conventional metal precursors and activated nonmetal sources. Additionally, substrate preparation methods for optimized ALD are disclosed.

3 Claims, 12 Drawing Sheets

U.S. PATENT DOCUMENTS

| | | |
|---|---|---|
| 6,093,625 A * | 7/2000 | Wagner et al. ............... 438/514 |
| 6,124,218 A | 9/2000 | Hwang et al. |
| 6,198,220 B1 | 3/2001 | Jones et al. |
| 6,200,893 B1 | 3/2001 | Sneh |
| 2003/0040196 A1 * | 2/2003 | Lim et al. .................... 438/785 |

* cited by examiner

PRIOR ART 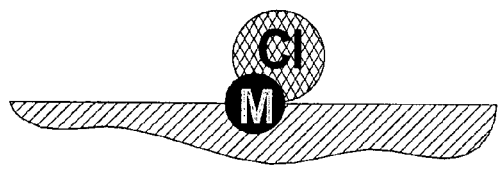 CRISP 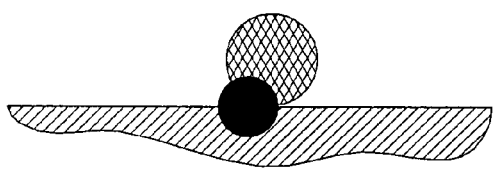
302  322
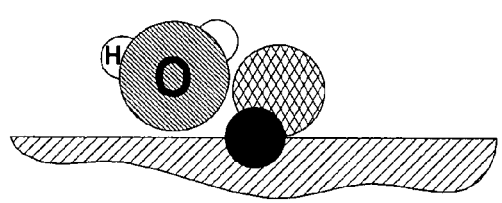 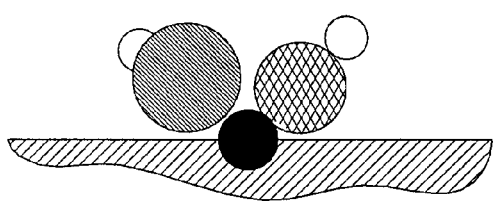
305  325
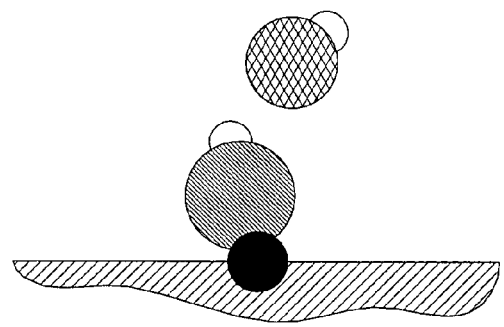 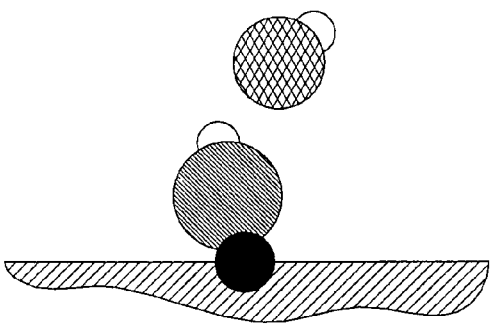
310  330
FIG. 6A  FIG. 6B

ALD METHOD AND APPARATUS

RELATED APPLICATIONS

This application is a divisional application of U.S. patent application Ser. No. 10/384,504 filed Mar. 7, 2003, now U.S. Pat. No. 7,250,083, which claims the benefit of U.S. Provisional Patent Application No. 60/362,870, filed Mar. 8, 2002.

BACKGROUND OF THE INVENTION

1. Field of the Invention

This invention relates to the field of integrated circuit fabrication, and more particularly to methods and apparati for improving atomic layer deposition and other chemical reaction techniques.

2. Description of Prior Art

Thin film deposition is common in the fabrication of semiconductor devices and many other useful devices. Chemical vapor deposition (CVD) techniques utilize chemically reactive molecules that react on a substrate to deposit a desired film. Reactants in CVD processes comprise volatile molecules that can be practically delivered, in the gas phase, to react on the substrate to deposit a desired film.

Conventional CVD is practiced in the art by a variety of techniques. Desired thin film properties and cost-effective operational parameters influence the choice of equipment, precursor composition, pressure range, temperature, and other variables. Common to most CVD techniques is the application of a well-controlled flux of one or more molecular precursors into the CVD reactor. A substrate is kept at a well-controlled temperature under well-controlled pressure conditions to promote chemical reaction between the molecular precursors concurrent with efficient desorption of by-products. The chemical reaction is allowed to proceed to deposit the desired thin film with a desired film thickness.

Optimum CVD performance directly correlates with the ability to achieve and sustain steady-state conditions of flux, temperature, and pressure throughout the process, in which unavoidable transients are suppressed or minimized. CVD has provided uniform and conformal coatings with reproducible thickness and exceptional quality.

Nevertheless, as device density increases and device geometry becomes more complicated in integrated circuit devices, the need for thinner films with superior conformal coating properties has approached the limits of conventional CVD techniques and new techniques are needed. An emerging variant of CVD, atomic layer deposition ("ALD") offers superior thickness control and conformality for advanced thin film deposition.

ALD is practiced by dividing conventional thin-film deposition processes into single atomic layer deposition steps that are self-terminating and deposit precisely one atomic layer when conducted up to or beyond self-termination exposure times. An atomic layer typically equals about 0.1 molecular monolayer to 0.5 molecular monolayer. The deposition of an atomic layer is the outcome of a chemical reaction between a reactive molecular precursor and the substrate. In each separate ALD reaction-deposition step, the net reaction deposits the desired atomic layer and eliminates the "extra" atoms originally included in the molecular precursor.

In ALD applications, typically two molecular precursors are introduced into the ALD reactor in separate stages. For example, a metal precursor molecule, $ML_x$, comprises a metal element, M (e.g., M=Al, W, Ta, and Si), that is bonded to atomic or molecular ligands, L. The metal precursor reacts with the substrate. This ALD reaction occurs only if the substrate surface is prepared to react directly with the molecular precursor. For example, the substrate surface typically is prepared to include hydrogen-containing ligands, AH, that are reactive with the metal precursor. The gaseous precursor molecule effectively reacts with all the ligands on the substrate surface, resulting in deposition of an atomic layer of the metal: substrate $-AH + ML_x \rightarrow$ substrate $-AML_{x-1} + HL$, where HL is a reaction by-product. During the reaction, the initial surface ligands, AH, are consumed, and the surface becomes covered with L ligands, which cannot further react with metal precursor $ML_x$. Therefore, the reaction self-terminates, or "saturates", when all the initial AH-ligands on the surface are replaced with $AML_{x-1}$ species. The resulting substrate-$AML_{x-1}$ surface is an ALD intermediate surface, which is essentially covered with the L ligands.

The reaction stage is typically followed by an inert-gas purge stage that eliminates the metal precursor from the chamber prior to the separate introduction of the other precursor.

A second molecular precursor then is used to restore the surface reactivity of the substrate towards the metal precursor. This is done, for example, by removing the L ligands and redepositing AH ligands. In this case, the second precursor typically comprises the desired (usually nonmetallic) element A (i.e., O, N, S), and hydrogen (i.e., $H_2O$, $NH_3$, $H_2S$). The reaction, substrate $-ML + AH_y \rightarrow$ substrate $-M$ $-AH + HL$, (here, for the sake of simplicity, the chemical reactions are not balanced) converts the surface back to being AH-covered. The desired additional element, A, is incorporated into the film and the undesired ligands, L, are eliminated as volatile by-product. Once again, the reaction consumes the reactive sites (this time, the L-terminated sites) and self-terminates (saturates) when the reactive sites on the substrate are entirely depleted. A different, second ALD intermediate surface is thereby created. In the simple example given here, the second intermediate ALD surface is similar to the initial surface, where the initial surface represents the surface prior to the introduction of the metal precursor.

Typically, the second molecular precursor then is removed from the deposition chamber by flowing inert purge-gas in a second purge stage.

This sequence of surface reactions and precursor-removal that restores the substrate surface to its initial reactive state is a typical ALD deposition cycle. Restoration of the substrate to its initial condition is a key aspect of ALD. It implies that films can be layered down in equal metered sequences that are all identical in chemical kinetics, deposition per cycle, composition, and thickness. Self-saturating surface reactions make ALD insensitive to transport nonuniformity. This transport nonuniformity may pertain either to the engineering and the limitations of the flow system or could be related to surface topography (i.e., deposition into three-dimensional, high-aspect ratio structures). Nonuniform flux of chemicals can only result in different completion times at different areas. However, if each of the reactions is allowed to complete on the entire substrate surface, the different completion kinetics bear no penalty. This is because the areas that are first to complete the reaction self-terminate the reaction, while the rest of the area on the surface is able to complete the reaction, self-terminate, and essentially catch up.

Efficient practice of ALD requires an apparatus capable of changing the flux of chemicals from $ML_x$ into $AH_y$ abruptly and fast. Furthermore, the apparatus must be able to carry this sequencing efficiently and reliably for many cycles to facilitate cost-effective coating of many substrates. Typically, an ALD process deposits about 0.1 nanometer (nm) of a film per ALD cycle. A useful and economically feasible cycle time must accommodate a thickness in a range of about from 3 nm to 30 nm for most semiconductor applications, and even thicker films for other applications. Industry throughput standards dictate that substrates be processed in 2 minutes to 3 minutes, which means that ALD cycle times must be in a range of about from 0.6 seconds to 6 seconds. Multiple technical challenges have so far prevented cost-effective implementation of ALD systems and methods for manufacturing of semiconductor devices and other devices.

Generally, an ALD process requires alternating in sequence the flux of chemicals to the substrate. A representative ALD process, as discussed above, requires four different operational stages:

1. $ML_x$ reaction;
2. $ML_x$ purge;
3. $AH_y$ reaction; and
4. $AH_y$ purge.

Given the need for short cycle times, chemical delivery systems suitable for use in ALD must be able to alternate incoming molecular precursor flows and purges with subsecond response times. Also, if significant flow nonuniformities exist, these can be overcome through the self-terminating nature of the chemical reactions by increasing the reaction-stage time to the time dictated by areas that are exposed to the smallest flux. Nevertheless, this necessarily degrades throughput since cycle times increase correspondingly.

In order to minimize the time that an ALD reaction needs to reach self-termination, at any given reaction temperature, the flux of chemicals into the ALD reactor must be maximized. In order to maximize the flux of chemicals into the ALD reactor, it is advantageous to introduce the molecular precursors into the ALD reactor with minimum dilution of inert gas and at high pressures. On the other hand, the need to achieve low short cycle times requires the rapid removal of these molecular precursors from the ALD reactor. Rapid removal in turn dictates that gas residence time in the ALD reactor be minimized. Gas residence times, $\tau$, are proportional to the volume of the reactor, V, the pressure, P, in the ALD reactor, and the inverse of the flow, Q, $\tau = VP/Q$. Accordingly, lowering pressure (P) in the ALD reactor facilitates low gas residence times and increases the speed of removal (purge) of chemical precursor from the ALD reactor. In contrast, minimizing the ALD reaction time requires maximizing the flux of chemical precursors into the ALD reactor through the use of a high pressure within the ALD reactor. In addition, both gas residence time and chemical usage efficiency are inversely proportional to the flow. Thus, while lowering flow will increase efficiency, it will also increase gas residence time.

Conventional ALD apparati have struggled with the trade-off between the need to shorten reaction times and improve chemical utilization efficiency, and, on the other hand, the need to minimize purge-gas residence and chemical removal times. Certain ALD systems of the prior art contain chemical delivery manifolds using synchronized actuation of multiple valves. In such systems, satisfactory elimination of flow excursions is impossible because valve actuation with perfect synchronization is itself practically impossible. As a result, the inevitable flow excursions are notorious for generating a backflow of gas that leads to adverse chemical mixing. Improved methods and systems of ALD using synchronous modulation of flow and draw ("SMFD") are disclosed in co-owned and copending U.S. patent application Ser. No. 10/347,575, filed Jan. 17, 2003, which is hereby incorporated by reference.

Practical implementation of conventional ALD in commercial manufacturing applications is also limited by a scarcity of suitable chemical sequences, for example, an $ML_x$ and $AH_y$ sequence (and sometimes by sequences requiring more than two chemicals), that enable the desired deposition with adequate speed and with adequate results. Chemical sequences suitable for conventional ALD are not generic. ALD precursors should be stable at the reaction temperature. Self-decomposition of ALD precursors at the reaction temperature prevents self-limitation, or saturation. ALD precursors should react efficiently with the intermediate surface that is created by the previous chemical reaction in an ALD cycle. For example, $ML_x$ molecules should react efficiently with the surface terminated with AH species. If the reactions are not efficient, reaction times must be extended to allow for the reactions to occur. Increasing reaction times limits the throughput that can be achieved. In addition, unreacted ligands, for example, the –AH and –ML ligands, can degrade the purity of a film by inclusion of undesired elements into the film, such as H and the elements composing the ligand L in the above. Furthermore, a molecular ALD precursor, such as $ML_x$, should react only with some of their ligands, while other ligands should stay attached to the surface. For example, –ML should saturate the surface in a self-terminating reaction to serve effectively as the reactive site on the immediate surface available to react with the other molecular precursor, for example, $AH_y$. Reaction by-products should be volatile. For example, the HL reaction by-product, which evolves both from the reaction of $AH_y$ on –ML surfaces and from the reaction of $ML_x$ on –AH surfaces, must be volatile. Finally, the surface species that are left on an intermediate surface following the completion and self-termination of ALD reactions should be stable, with no or minimized desorption during the time that is practically necessary to remove the excess precursor and reaction by-products and the time that it takes to complete the next surface reaction in sequence. For example, the –ML surface termination sites should be stable during the time that it takes to sweep the $ML_x$ molecules out of the reaction chamber and the time necessary for the next reaction with $AH_y$ to complete.

These requirements for ALD precursor selection (e.g., pairs, triplets) impose limitations on the films that can be produced in manufacturing-grade ALD processes, due to the limitations on reaction rates and film purity caused by chemical sequences that do not meet these requirements. Accordingly, although many different types of films have been deposited using ALD processes conducted in research settings, very few of these films (and related processes) are suitable for use in commercial ALD manufacturing. Unfortunately, the limited number of films suitable for use in commercial ALD manufacturing applications does not include many of the films having potential commercial importance. For example, an adequate ALD precursor combination has not been found in the prior art for single-element metal and semiconductor films needed for semiconductor applications, such as titanium, tantalum, copper, silicon, and tungsten. Likewise, most nitride films, such as TiN, $TaN_x$, $WN_x$, and $Si_3N_4$, have not been demonstrated with precursor-combinations that are adequate for cost-effective production. Also, many dielectric materials that are desired in the manufacture of semiconductor and other devices have not been demonstrated with adequate precursor combinations. Accordingly, there is a need to develop a greater variety of precursor combinations that are suitable for commercial ALD manufacturing applications.

In addition to the aforementioned limitations, ALD has another serious fundamental limitation. Unlike CVD reactions (usually steady-state) that are continuous and non-saturating, ALD reactions follow kinetics of molecule-surface interaction. The kinetics of molecule-surface reactions depend on the individual reaction rate between a molecular precursor and a surface reactive site and on the number of available reactive sites. As the reaction proceeds to completion, the surface is converted from being reactive to non-reactive. As a result, the actual process rate is slowing down during the deposition. Accordingly, ALD completion rates, dN/dt, are proportional to the number of reactive sites, dN/dt=−kN, where N is the number of reactive sites and k is the (single site) reaction rate. Elimination of the reactive sites for reaction follows an exponential time dependence $N(t)=N_0 exp(-kt)$. Accordingly, the "self-terminating" reactions essentially never self-terminate (as they would require an infinite time to terminate because the rate is exponentially decreasing). This fundamental property of molecule-surface kinetics was named after the scientist Langmuir, and is well known in the art of surface science. The limitations of Langmuirian kinetics present a significant limitation on overall throughput in conventional ALD.

As noted above, the limitations described by Langmuirian kinetics dictate that the surface is never "completely" reacted. If the surface is not completely reacted, there are necessarily leftover undesired elements in the film. For example, if an $ML_x$ reaction does not totally consume the surface −AH sites, then the film incorporates H. Likewise, if the $AH_y$ reaction is not carried to completion, undesired L-incorporation results. The quality of a film depends on impurity levels. Thus, ALD suffers from a throughput-quality tradeoff. Namely, to achieve greater throughput, it is generally assumed that quality must be sacrificed, and vice-versa. This throughput-quality tradeoff is of particular concern because it carries an exponential throughput penalty to attain a linear reduction of impurity levels.

Most critical applications of ALD films, particularly of semiconductor films, include stringent specifications regarding impurity levels. Accordingly, to achieve low impurity levels, ALD reactions typically must be conducted beyond 99% saturation. As noted above, however, Langmuirian kinetics dictate that conducting an ALD reaction up to or beyond 99% saturation typically causes a serious reduction in throughput.

Elevating ALD process temperatures potentially overcomes the limitations posed by Langmuirian kinetics since ALD reactions are thermally activated. Nevertheless, in most cases, ALD process temperatures are practically limited by one or more of the following factors: 1) device manufacturing integration becomes more difficult at increased process temperatures; 2) instability of surface ligands and molecular precursors generally increases with process temperature; and 3) deposition per cycle inherently decreases with increased process temperature for most known ALD processes, thus resulting in the need to run more cycles to deposit the film up to the target thickness. As a result, many specific ALD precursor combinations and potential ALD films are rendered inadequate for cost-effective commercial ALD manufacturing applications. Accordingly, there is a need for ALD methods and apparati that enable a generic approach for ALD implementations, and that allow fabrication of a larger range of ALD films at commercially feasible throughput and quality levels. Likewise, there is a need for ALD methods and apparati that can surmount the Langmuirian limitations and enhance reaction kinetics without sacrificing film purity.

Despite the limitations of conventional ALD, ALD films have the potential to provide a number of commercial manufacturing advantages. For example, ALD films have unique pinhole free and low stress advantages. Accordingly, ALD films are ideal for device passivation and encapsulation applications. Much thinner encapsulation films can be realized by ALD than with conventional encapsulation processes. Such thinner encapsulation films are advantageous for minimized alteration of device performance. For example, it is desirable to encapsulate display and optical devices by very thin films that minimize impact on light output. However, material and process constraints of many devices limit many passivation and encapsulation techniques for such devices to process temperatures not exceeding 200° C., and sometimes to less than 100° C. In addition, some display and optical devices, for example, Organic Light Emitting Diode (OLED) display devices, are extremely sensitive to moisture and oxidizing conditions. The organic materials commonly used in OLEDs are particularly susceptible to damage caused by exposure to the ambient atmosphere, as well as to reactions of organic compounds with electrode materials. Furthermore, the metals typically utilized as OLED cathodes are highly reactive with oxygen and water and may be negatively affected by oxidation. OLED device encapsulation and protection from moisture and oxygen is currently accomplished by glass windows and vacuum sealing techniques that are costly and cumbersome. Accordingly, there is a need to develop a commercially feasible thin film encapsulation method and apparatus for use in OLED manufacturing that meets the above-mentioned needs.

In particular, there is a need for ALD methods with a generic approach that can increase reaction rates, that are fast and efficient even at low temperatures, and that allow flexibility in the choice of metal ALD precursors.

SUMMARY OF THE INVENTION

The present invention helps to solve some of the problems discussed above by providing systems, methods, and compositions for effecting a chemical treatment of a substrate.

A method in accordance with the invention includes a continuous, non-saturating surface chemical reaction, referred to herein with the term "catalyzing reaction". A catalyzing reaction in accordance with the invention does not, by itself, deposit solid material on the surface. A catalyzing reaction requires two or more reactive chemicals, referred to herein as "catalyzing reactants", that react with each other, preferably vigorously, to produce a stable volatile by-product molecule and an unstable surface-adsorbed intermediate reactive molecular fragment. A catalyzing reaction is thermodynamically driven and is irreversible by virtue of volatilization of the stable by-product. The reactive molecular fragments generated in catalyzing reactions generally form as adsorbed radical species. These adsorbed reactive molecular fragments are atomic or molecular sections, or both. Nevertheless, when the surface contains reactive sites, a reactive fragment reacts with a reactive site in a fragment-surface reaction, typically producing a volatile surface by-product or being incorporated into a growing film, or both. Thus, a catalyzing reaction generally proceeds (cascades) from catalyzing reactants to a final volatile species from both the catalyzing reaction and from the reactive sites on the surface.

Catalyzing reactions are distinctively continuous. Nevertheless, in most methods including a continuous catalyzing reaction in accordance with the invention, the catalyzing reaction is part of a process at a substrate having a saturating nature, such as an ALD reaction stage, a surface treatment step, or a surface cleaning step. Therefore, catalyzing reactions are uniquely different from saturating ALD or substrate treatment processes of the prior art. When a saturating process that is driven by a continuous catalyzing reaction in accordance with the invention reaches saturation, the catalyzing reactions possess an additional unique characteristic; namely, they have a non-damaging path for complete volatilization of all parts of the catalyzing reactants. While saturating processes are practically implemented only approaching saturation (since ideal saturation requires infinite time), they are clearly converging. In contrast, a catalyzing reaction in accordance with the invention continues as long as the corresponding catalyzing reactants are present.

Catalyzing surface reactions (CSR) can serve as a source for hydrogen atoms, as well as other reactive species, that are necessary for the nonmetal ALD reaction. In this respect, a chemical process is enhanced by the addition of one or several continuous chemical reactions that are capable of producing intermediate reactive molecular fragments. These reactive intermediates further react in the chemical process. Since the sole purpose of these additional side-reactions is to produce reactants for the original process, they are referred to as Catalyzing Reactions for Induced Surface Process (CRISP) in this application. CRISPs are designed to provide a volatilization path for adsorbed reactive species when the surface reactive sites are depleted. Accordingly, CRISPs are robust and can be carried excessively beyond saturation to ensure reproducible and satisfactory results.

This specification discloses methods and systems for achieving the effects of reactive radical species without the need to generate and deliver these reactive species from remote locations. Accordingly, metal ALD can be done effectively. ALD of compound films also can be implemented with these methods. In addition, surfaces of silicon, metal, and metal nitride can be effectively cleaned. In another extension of the technique, clean surfaces of metal and semiconductor substrates are terminated with a monolayer of H, OH, and NH surface species that is advantageous for the growth of ALD films on these surfaces with reproducible results.

It is the primary objective of the present invention to provide a cost-effective method and apparatus to practice ALD at low temperatures. It is a further objective of the invention to provide an efficient ALD process that is capable of preparing intermediate ALD surfaces for reaction with metal precursors, therefore enabling ALD. It is an additional objective of the invention to efficiently prepare intermediate ALD surfaces for reaction with metal precursors under mildly oxidizing and moisture free conditions.

Still another objective of the invention is to provide a method and apparatus for ALD film growth over temperature-sensitive devices. It is also the objective of the invention to produce protective ALD films over substrates that are sensitive to moisture and oxidizing environments without deteriorating device performance. It is yet another objective of the invention to provide damage-free encapsulation of OLED display devices.

It is also the objective of the invention to provide a generic method and processes that can substitute for the usage of non-metal ALD precursors, wherein these processes are far more efficient and far less damaging to sensitive substrates. It is yet another objective of the invention to provide substrate preparation for ALD.

In one aspect, a CRISP method in accordance with the invention includes: introducing a first catalyzing reactant into a reaction chamber, and introducing a second catalyzing reactant into the reaction chamber, wherein the first catalyzing reactant and the second catalyzing reactant react in a catalyzing reaction, the catalyzing reaction is continuous and non-saturating, and the catalyzing reaction generates a volatile by-product and an intermediate reactive molecular fragment. In another aspect of the invention, the intermediate reactive molecular fragment reacts with an intermediate ALD surface in a saturating fragment-surface reaction.

In another aspect of the invention, a CRISP method often includes more than two catalyzing reactants, and the plurality of catalyzing reactants reacts in a catalyzing reaction as described above.

An ALD method in accordance with the invention includes an ALD cycle comprising a saturating chemical dosage stage and a saturating CRISP stage, which includes a CRISP method as outlined above. In another aspect of the invention, an ALD method in accordance with the invention further includes conducting a deactivation or a purge stage after the saturating fragment-surface reaction of the CRISP stage. In another aspect of the invention, the fragment-surface reaction generates a second intermediate ALD surface. In another aspect of the invention, the saturating chemical dosage stage includes: introducing a metal ALD precursor that reacts with the second intermediate ALD surface in an actuating metal precursor-surface reaction, and the metal precursor-surface reaction generates an intermediate ALD surface.

In another aspect of the invention, the metal precursor in the saturating chemical dosage stage includes an atom selected from a group including Al, Si, Ti, Ni, Cu, Zn, Ga, Ge, Y, Zr, Nb, Mo, Ru, In, Sn, Hf, Ta, and W. In this specification, the term "metal precursor" is used generally to refer to a precursor for either a metal or a semiconductor atom.

In another aspect of the invention, an ALD method in accordance with the invention is characterized in that the saturating CRISP stage further comprises varying a flow rate ratio of the catalyzing reactants during the CRISP stage to effect a plurality of catalyzing reactions in sequence, such that each of the catalyzing reactions is continuous and non-saturating, each of the catalyzing reactions generates a volatile by-product and an intermediate reactive molecular fragment, and each intermediate reactive molecular fragment reacts with an intermediate ALD surface in a fragment-surface reaction in a cascade of saturating fragment-surface reactions. In another aspect of the invention, a flow rate ratio is varied so that a fragment-surface reaction substantially saturates before a succeeding fragment-surface reaction of the cascade of fragment-surface reactions begins. In another aspect of the invention, a first catalyzing reaction generates a first intermediate reactive molecular fragment, the first intermediate reactive molecular fragment reacts with a first intermediate ALD surface in a first saturating fragment-surface reaction, and the first fragment-surface reaction generates a second intermediate ALD surface. In another aspect of the invention, a second catalyzing reaction generates a second intermediate reactive molecular fragment, the second intermediate reactive molecular fragment reacts with the second intermediate ALD surface in a second saturating fragment-surface reaction, and the second fragment-surface reaction generates a third intermediate ALD surface.

In another aspect of the invention, in the CRISP stage, a final fragment-surface reaction of the cascade of fragment-surface reactions occurs at an intermediate ALD surface and generates a final intermediate ALD surface, and the saturating chemical dosage stage includes introducing a metal ALD precursor that reacts with the final intermediate ALD surface in a saturating metal precursor-surface reaction that generates an initial intermediate ALD surface.

In another aspect of the invention, an ALD cycle in accordance with the invention includes a saturating chemical dosage stage and a saturating CRISP stage, and another ALD cycle comprises a saturating chemical dosage stage and a saturating surface restoration stage. In still another aspect of the invention, an ALD cycle comprises a first-type saturating chemical dosage stage and a corresponding first-type saturating CRISP stage, and another ALD cycle comprises a second-type saturating chemical dosage stage and a corresponding second-type saturating CRISP stage. In another aspect of the invention, the first-type saturating chemical dosage stage includes introducing a first metal ALD precursor that reacts with a first intermediate ALD surface in a first saturating metal precursor-surface reaction, and the first metal precursor-surface reaction generates a first-metal intermediate ALD surface, and the corresponding first-type saturating CRISP stage terminates the substrate surface with a second intermediate ALD surface; and the second-type saturating chemical dosage stage includes introducing a second metal ALD precursor that reacts with the second intermediate ALD surface in a second saturating metal precursor-surface reaction, the second metal precursor-surface reaction generates a second-metal intermediate ALD surface, and the corresponding second-type saturating CRISP stage terminates the substrate surface with an intermediate ALD surface. In still another aspect of the invention, the second-type saturating CRISP stage terminates the substrate surface with the first intermediate ALD surface. In another aspect of the invention, the first intermediate ALD surface and the second intermediate ALD surface are terminated substantially similarly. In another aspect of the invention, the first-type saturating CRISP stage and the second-type saturating CRISP stage are substantially similar.

In certain embodiments in accordance with the invention, an ALD cycle comprises, in sequence, a saturating chemical dosage stage that includes flowing a chemical precursor gas through the reaction chamber at a selected first-dosage flow rate and at an independently selected first-dosage pressure; then conducting a first purge stage by flowing a first purge gas through the reaction chamber at a selected first purge flow rate and at an independently selected first purge pressure; and then in a CRISP stage, flowing the catalyzing reactants through the reaction chamber at a selected second-dosage flow rate and at an independently selected second-dosage pressure. In another aspect of the invention, the ALD cycle includes conducting a second purge stage after a saturating fragment-surface reaction of the CRISP stage by flowing a second purge gas through the reaction chamber at a selected second purge flow rate and at an independently selected second purge pressure. A further embodiment in accordance with the invention includes initiating the saturating chemical dosage stage by initially flowing the chemical precursor gas at a first transient flow rate, the first transient flow rate being initially substantially greater than the first-dosage flow rate. In another aspect of the invention, the ALD cycle includes initiating the CRISP stage by initially flowing the catalyzing reactant gases at second transient flow rates, the second transient flow rates being initially substantially greater than the second-dosage flow rates.

In another aspect of the invention, certain embodiments in accordance with the invention include utilizing SMFD techniques and systems, as described in U.S. patent application Ser. No. 10/347,575. Generally, in a CRISP ALD method in accordance with the invention incorporating SMFD aspects, flowing a chemical precursor gas through the reaction chamber includes controlling a chemical-dosage pressure in the reaction chamber by controlling a draw-control pressure in a draw control chamber located downstream from the reaction chamber. In a further aspect of the invention, flowing catalyzing reactants through the reaction chamber comprises controlling a CRISP-pressure in the reaction chamber by controlling a draw-control pressure in a draw control chamber located downstream from the reaction chamber.

In another aspect of the invention, in a CRISP method in accordance with the invention, the catalyzing reaction generates a plurality of intermediate reactive molecular fragments. Frequently, the intermediate reactive molecular fragments comprise a hydrogen atom and a molecular fragment selected from a group including OH, NH, $NH_2$, SH, SeH, AsH, and $AsH_2$. In another aspect of the invention, controlling a flow rate ratio of the catalyzing reactants into the reaction chamber serves to control relative surface concentrations of the plurality of intermediate reactive molecular fragments, typically the surface concentrations of hydrogen atoms and other molecular fragments.

An important aspect of a CRISP method in accordance with the invention is that the thermodynamically-driven catalyzing CRISP reaction occurs at low temperatures compared to reactions in conventional processes. Therefore, a chemical treatment process that includes a CRISP stage can be conducted practically at a lower temperature than a process without CRISP. For example, a CRISP ALD method is typically performed at a temperature not exceeding 200° C., and frequently at a temperature not exceeding 100° C.

In another aspect of the invention, in an ALD process including CRISP, the plurality of catalyzing reactants comprises a first type of catalyzing reactant and a second type of catalyzing reactant; and the first type of catalyzing reactant is selected from a group including $O_3$, $F_2$, $NF_3$, $ClF_3$, HF, $F_2O$, FI, FNO, $N_2F_2$, $F_2O_2$, and $F_4N_2$, and the second type of catalyzing reactant is selected from a group including $CH_4$, CN, $C_2H_8N_2$, $CH_5N$, $CH_6N_2$, $C_2H_2$, $C_2H_3N$, $C_2H_4$, $C_2H_4S$, $C_2H_5N$, $C_2H_6S$, $C_2H_6S_2$, $C_3H_6S$, $SiH_4$, $B_2H_6$, $Si_2H_6$, $SiH_2Cl_2$, and $PH_3$.

In another aspect of the invention, an ALD CRISP process for depositing an oxide film is characterized in that the saturating CRISP stage is conducted without using $H_2O$.

In another aspect of the invention, at least one ALD cycle is conducted under mild oxidizing conditions. In still another aspect of the invention, at least one ALD cycle is conducted under mild oxidizing conditions, and at least one ALD cycle is conducted under strong oxidizing conditions.

In the general case of depositing a compound film MA by CRISP ALD, the metal precursor $ML_x$ is deployed to react AH-terminated intermediate surfaces to deposit a layer of M terminated with L ligands and self saturate. Following the removal of excess $ML_x$, the $AH_y$ precursor is substituted by a mixture of strong oxidizer, such as $O_3$ (ozone), and a hydrocarbon molecule, such as $CH_4$ (methane). Vigorous surface reaction between $O_3$ and $CH_4$ produces volatile $CO_2$ and CO molecules and provides an ample supply of adsorbed OH and H species. These species effectively substitute L ligands with OH (A=O in this example) and desorb the ligands as HL by-products. The net outcome parallels the results of the $AH_y$ reaction. However, A, AH, and H are effectively broken down and supplied at their most reactive form. Therefore, the reaction is efficient at low temperatures. In addition, surface exposure to strong oxidants is minimized by controlling the ratio between $CH_4$ (or other hydrocarbons) and $O_3$. Finally, oxide growth is accomplished without exposing sensitive devices to $H_2O$.

Nitrogen-containing hydrocarbon molecules, such as CN (cyanide) and $C_2H_8N_2$ (dimethylhydrazine), can be used to incorporate nitrogen into growing films in order to deposit nitride or oxinitride compound films. $CH_4$ or other simple hydrocarbon molecules can be added to increase hydrogen concentrations on the surface and further suppress the residence time of $O_3$ on the surface. Conditions may be set to efficiently eliminate oxygen by CO and $CO_2$ generation while the surface is supplied with ample concentrations of hydrogen and nitrogen. Thermodynamics dictate the coverage of surface $NH_x$ species while excessive amounts of H and N recombine into volatile $H_2$, $N_2$, $NH_3$, and other possible nitrogen hydride compounds.

The ratio of $C_pH_q$ to $O_3$ in the case of oxide deposition depends on the sensitivity of the substrate to oxidizing conditions. The residence time of $O_3$ and the relative abundance of surface OH and other oxidizing species inversely depends on the hydrocarbon:$O_3$ concentration ratio. Accordingly, sensitive substrates may dictate that the CRISP steps are executed under large hydrocarbon:$O_3$ concentration ratio conditions. However, CRISP reaction rates may slow down under mildly oxidizing conditions. A useful approach implements large hydrocarbon:$O_3$ concentrations for the deposition of the first few layers of oxide and a smaller ratio for the deposition of bulk film. This approach provides mild exposure of sensitive substrates to oxidizing conditions, possibly at the tradeoff of slower reaction rates, while the majority of the film is executed under more oxidizing and higher throughput conditions that are possible once the substrate is protected with continuous film. Recipe writing flexibility to tune oxidizing conditions is another strength of CRISP ALD.

In addition to hydrocarbon-oxidant CRISP processes that are driven by the stability and volatility of CO and $CO_2$, another approach implements CRISP with hydride molecules, $AH_p$, and fluorine containing molecules, $DF_q$, where the creation of volatile $AF_p$ fluoride molecules is the driving force behind the CRISP. This approach may be preferred if usage of oxygen-containing catalyzing reactants is absolutely prohibited. Accordingly, two catalyzing reactants, $AH_p$ and $DF_q$, are distributed over a substrate that is controlled at a sufficiently elevated temperature. Upon impingement on the surface, the reactants adsorbed and subsequently react:

$$qAH_p + pDF_q \rightarrow qAF_p + qH^* + pD^*, \quad (1)$$

where $H^*$ and $D^*$ represent unstable intermediates that were created on the surface. For example, $B_2H_6$ and $NF_3$ can facilitate growth of nitride films by providing highly reactive hydrogen and nitrogen. For example, TiN ALD may be facilitated by sequential exposures of $TiCl_4$ and $B_2H_6/NF_3$ CRISP. In this case, efficient application of CRISP with, for example, $B_2H_6$ and $NF_3$, replaces the ALD reactant, $NH_3$, to facilitate substantially more efficient nonmetal reaction.

Central to the CRISP method is the usage of hydrocarbons, such as $CH_4$ and $C_2H_4$, to react with strong oxidizing species such as $O_3$, or alternatively use hydride molecules such as $SiH_4$, $B_2H_6$, and $PH_3$, in combination with strong oxidants such as $NF_3$, $ClF_3$, and $F_2$ to generate stable and volatile CO, $CO_2$, or fluoride compounds such as $SiF_4$ or $BF_3$. The reaction between the above-mentioned hydrocarbon-oxidant or metal hydrides-fluoride molecules is extremely exothermic, being driven by the stability of CO, $CO_2$, or fluoride compounds. Accordingly, these reactions are potentially explosive and require specially designed methods and apparati to be conducted with good control. When used with adequate control, the combinations of hydrocarbon and strong oxidants or metal hydride and fluoride molecules are extremely driven and efficient, and are capable of providing ample amounts of hydrogen, nitrogen, and other reactive species at the exact point of use, i.e., the substrate.

CRISPs also enable eliminating the use of $AH_y$ precursors. These precursors can persistently adsorb on most surfaces, making them notorious for outgassing. Accordingly, CRISP substitutions of $AH_y$ molecules are substantially easier to remove from ALD reactors. In many instances, removal of CRISP reactants may not require an inert gas purge step. Rather, the flow of the oxidant, for example, $O_3$, may be terminated shortly prior to the termination of the hydrocarbon flow and the CRISP processes will decay as the $O_3$ (and other surface reactive species) recombine and desorb from all surfaces, while the $O_3$/hydrocarbon gas in the ALD reactor is replaced by hydrocarbon only. This short deactivation step further enhances the final throughput of CRISP ALD processes.

CRISP implementation to provide efficient ALD reactions can be carried in one step or in multiple cascading steps. For example, a first intermediate surface, covered with L ligands from the metal precursor, as described above, can be converted into an OH covered surface, for the deposition of oxide films with a single CRISP step where the catalyzing reaction provides hydrogen to volatilize the L ligands and both hydrogen and oxygen to generate the surface OH ligand. Alternatively, a cascade of two distinctively different CRISPs converts the surface to be H-covered with a first CRISP process, then with a second CRISP process converts the surface from H-coverage to OH-coverage. Each one of the two CRISP processes is carried to substantial saturation. A CRISP cascade is implemented to speed up reaction and to improve the quality of the film. The second intermediate ALD surface, in this case the OH-terminated surface, is produced at the end of the final CRISP process within the CRISP cascade.

One of the unique advantages of ALD processes is the ability to produce, by design, complex film compositions and structures. Combination films, such as hafnium-aluminate and titanium-tantalum nitride, are deposited using CRISP. Basically, these alloy or nanolaminate films are deposited by combining a variety of ALD processes that are used to deposit the individual ingredient films. For example, hafnium-aluminate films with a variety of combinations are implemented by alternating the ALD processes for aluminum oxide and hafnium oxide. As an obvious extension of this invention, CRISP ALD processes are combined with conventional ALD processes and/or other CRISP ALD processes to produce combination or composite ALD films.

Substrate preparation for ALD can significantly impact film growth and device performance. CRISP-based substrate preparation removes residual contamination and oxide from all types of surfaces by providing atomic hydrogen adsorbates on the surface. In addition, surface activation for ALD is accomplished by precise deposition of surface species, such as OH, NH, $NH_2$, SH, SeH, and $AsH_x$.

When metastable oxidants such as $O_3$ are being used, flow of CRISP reactants should compete with the rate of $O_3$ depletion. In the pressure range that is useful for ALD (100 mTorr to 1000 mTorr), the metastable species decay mainly by surface recombination. Surface recombination efficiencies of $O_3$ are rather low, making it a convenient reactive species. However, under conditions of very low flow, $O_3$ residence time may be longer than $O_3$ depletion time. Accordingly, flow of $O_3$ is best adjusted for maximized efficiency by increasing the flow rates to make depletion negligible.

Efficient CRISP ALD apparatus design provides separate delivery of catalyzing reactants. Gas phase reactions between catalyzing reactants do not affect the quality of films or increase equipment wear. However, given the short lifetime of hydrogen atoms, gas phase catalyzing reactions reduce the efficiency of CRISP processes. Other features of an efficient CRISP ALD apparatus are exemplified in the preferred embodiment description.

CRISP control is generally achieved by keeping one of the catalyzing reactants at low concentration. Accordingly, the rate of the reaction is determined by the concentration of the minority catalyzing chemical. This approach is also advantageous to suppress potential side reactions that may compete with the CRISP and for suppressing damage to the substrate.

In some applications, catalyzing reactions are applied to promote a continuous process. In these cases, such as CVD or etching, a catalytic reaction in accordance with the invention is faster, typically 10 times or more, than a chemical reaction involving the other CVD precursors. Also, catalyzing reactions have a path for complete volatilization of all atoms originally contained in the catalyzing reactants. Accordingly, catalyzing reactions can be conducted in a continuous process, such as CVD, in an advantageous mode in which the catalyzing reaction is controlled to be substantially excessive. In this mode, a substantial fraction of the catalytic reactants volatilize without reacting with the conventional CVD precursor; therefore, the CRISP part of the CVD process is relatively flux independent. Accordingly, a CVD process can be controlled by controlling the flux of fewer precursors, namely, the conventional CVD precursors. Preferably, the catalytic reaction is practically independent of the presence of the conventional CVD precursors, which improves the control of conformality, film quality, and pulse CVD mode.

A generalized CRISP method of treating a solid film on a substrate includes introducing a plurality of catalyzing reactants into a reaction chamber containing the solid film, so that the catalyzing reactants react in a continuous and non-saturating catalyzing reaction that generates a volatile by-product and an intermediate reactive molecular fragment, whereby the intermediate reactive molecular fragment reacts with the solid film in a fragment-film reaction, and further includes controlling a temperature of the chemical film to control the treating. In certain embodiments, the intermediate reactive molecular fragment comprises hydrogen, and the hydrogen is incorporated into the chemical film during the fragment-film reaction. In other embodiments, the intermediate reactive molecular fragment comprises a hydrogen atom, and the hydrogen improves the interface between the solid film and the substrate. In still other embodiments of the invention, the intermediate reactive molecular fragment comprises a hydrogen atom, and the hydrogen atom removes an in-film impurity. Examples of an in-film impurity removed by a CRISP method in accordance with the invention include F, O, OH, Cl, and C. In another example of a film treatment utilizing a CRISP method, the intermediate reactive molecular fragment comprises a dopant atom, and the dopant atom is incorporated into the chemical film during the fragment-film reaction. Examples of a dopant atom are B and P. In other embodiments of the invention, the treating comprises annealing the chemical film.

A method using CRISP is also utilized for activating a surface of a substrate. An example of such a method includes exposing the surface to a gas mixture comprising catalyzing reactants selected from a group of reactant combinations including $O_3$/hydrocarbon, hydride/oxyfluoride, $O_3$/nitrogen-containing-hydrocarbon, hydride/amine-fluoride, and $O_3$/sulfur-containing-hydrocarbon to effect surface hydroxylation. A method for activating a surface is useful, for example, for surfaces having a surface termination such as an oxide, a nitride, or a sulfide before activation. A CRISP activation method is utilized, for example, prior to deposition of an ALD layer comprising a material selected from a group including oxides, nitrides, sulfides, metals, and semiconductor atoms. Certain embodiments of an activation method using CRISP include exposing the surface to a gas mixture comprising catalyzing reactants selected from a group of reactant combinations including $O_3/CH_4$, $O_3/C_2H_2$, $O_3/C_2H_4$, $SiH_4/F_2O$, $B_2H_6/F_2O$, $Si_2H_6/F_2O$, $SiH_2Cl_2/F_2O$, $PH_3/F_2O$, $SiH_4/F_2O_2$, $B_2H_6/F_2O_2$, $Si_2H_6/F_2O_2$, $SiH_2Cl_2/F_2O_2$, and $PH_3/F_2O_2$.

An ALD apparatus in accordance with the invention preferably includes separate delivery of at least some of the catalyzing reactants to avoid a premature catalyzing reaction. Accordingly, an atomic layer deposition (ALD) apparatus preferably includes a first gas distribution chamber, a second gas distribution chamber, and a reaction chamber disposed downstream from the first and second gas distribution chambers. An SMFD ALD apparatus further includes a first gas-distribution flow restriction element (FRE), providing fluidic communication between the first gas distribution chamber and the reaction chamber, and a second gas-distribution flow restriction element (FRE), providing fluidic communication between the second gas distribution chamber and the reaction chamber. Preferably, an ALD apparatus includes a draw control chamber disposed downstream from the reaction chamber, a reaction-chamber FRE in fluidic communication between the reaction chamber and the draw control chamber, a draw exhaust line in serial fluidic communication with the draw control chamber, and a draw-control FRE in serial fluidic communication between the draw control chamber and the draw exhaust line. In another aspect, an ALD apparatus in accordance with the invention further includes a first catalyzing reactant source in fluid communication with, and disposed upstream from, the first gas distribution chamber, and a second catalyzing reactant source in fluid communication with, and disposed upstream from, the second gas distribution chamber. In another aspect, an ALD apparatus further includes a draw-source shut-off valve to control a flow of draw-gas through the draw control chamber, and a draw-source-FRE in serial fluidic communication with the draw-source shut-off valve and the draw control chamber. Preferably, an ALD apparatus further includes a draw gas introduction chamber ("DGIC") in serial fluidic communication between the reaction chamber and the draw control chamber, a draw-source shut-off valve to control a flow of draw gas into the DGIC, a draw-source-FRE in serial fluidic communication with the draw-source shut-off valve and the draw control chamber, and a DGIC-FRE located between the DGIC and the draw control chamber; wherein the reaction-chamber FRE is located between the process chamber and the DGIC. Certain embodiments further include an inert gas source in fluidic communication with a gas distribution chamber.

For low temperature applications, when extremely high doses of metal precursor are necessary, design of an SMFD apparatus includes a unique downstream split of process gas. Thus, in another aspect of the invention, an SMFD ALD apparatus allows splitting the draw (the flow out of an ALD reaction chamber) downstream of the draw control chamber. Such an apparatus, therefore, further includes a plurality of draw-control FREs and a plurality of after-draw control chambers. A typical embodiment includes a first after-draw control chamber located downstream from the draw control chamber, a first draw-control FRE disposed between the draw control chamber and the first after-draw control chamber, a first after-draw FRE in serial fluidic communication between the first after-control chamber and the exhaust line, a second after-draw control chamber located downstream from the draw control chamber, a second draw-control FRE disposed between the draw control chamber and the second after-draw control chamber, and a second after-draw FRE in serial fluidic communication between the second after-control chamber and the exhaust line. As explained below, a flow of after-draw gas into an after-draw control chamber is utilized for controlling the relative pressures of after-draw control chambers and thereby controlling the distribution of process gas flow between the after-draw control chambers. Certain embodiments of an ALD apparatus further comprise an abatement element disposed in an after-draw control chamber.

ALD reactions are thermally activated and, therefore, slow down at low temperatures. Metal precursor reactions are typically very efficient. Accordingly, most metal precursors can be used with practical efficiency at temperatures below 100° C. In conventional ALD processes of the prior art, the reactions of non-metal precursors, $AH_y$, tend to be relatively inefficient and practically useless at temperatures below 200° C. Therefore, in a method in accordance with the invention, conventionally used non-metal precursors such as $H_2O$, $NH_3$, and $H_2S$ are replaced with significantly more reactive precursors.

BRIEF DESCRIPTION OF THE DRAWINGS

FIGS. 6A and 6B illustrate schematically a comparison of the intermediate steps of a conventional ALD (FIG. 6A) and a CRISP ALD (FIG. 6B) in accordance with the invention occurring during conversion of an –MCl covered surface into a M–OH covered surface;

DETAILED DESCRIPTION OF THE INVENTION

Figure 1:
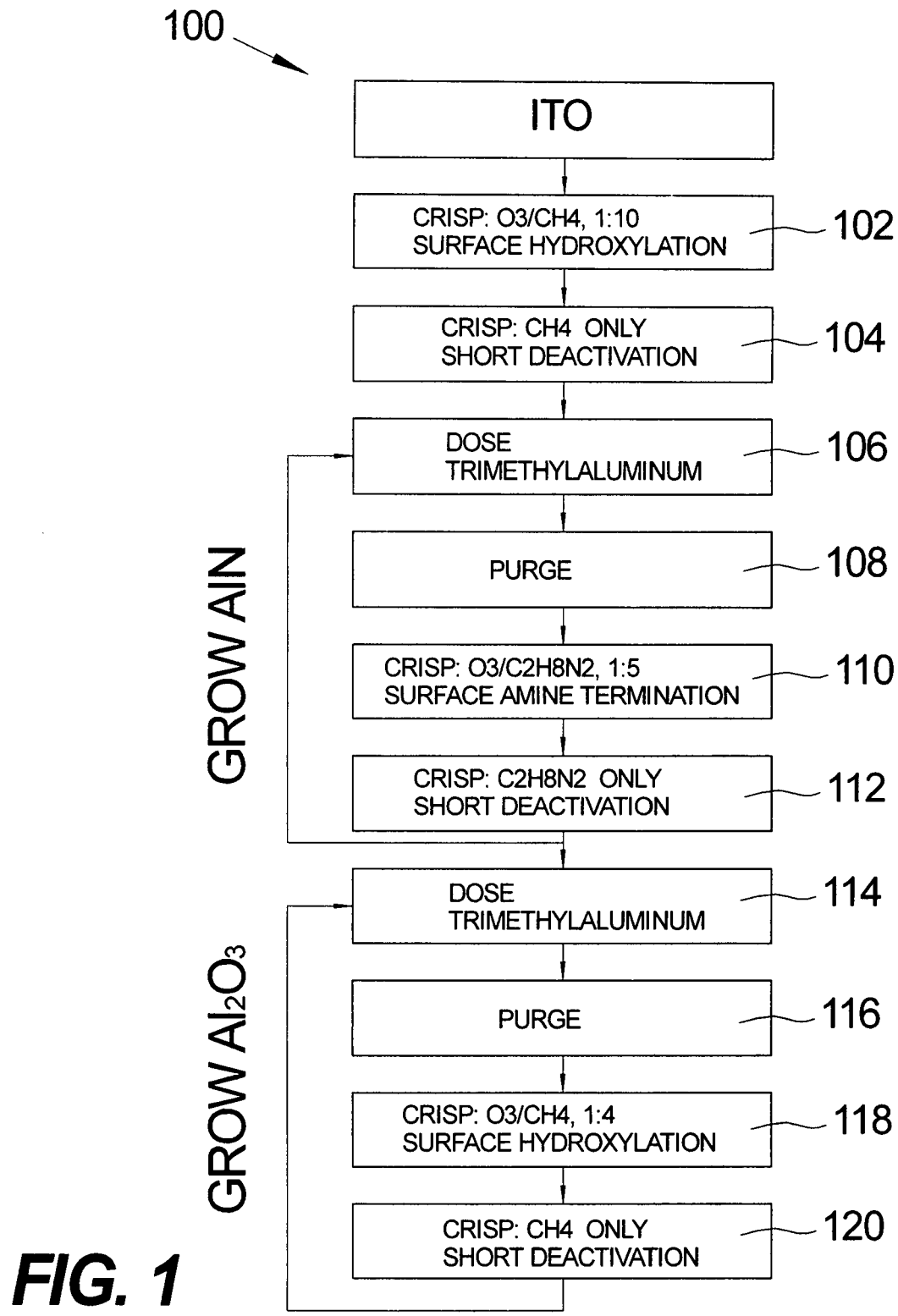
FIG. 1 contains a process flow sheet of a CRISP ALD process in accordance with the invention for deposition of an $AlN/Al_2O_3$ film stack over an ITO substrate.

The invention is described herein with reference to FIGS. 1-13. For the sake of clarity, the same reference numerals are used in several figures to refer to similar or identical components. It should be understood that the structures, methods, and systems depicted in schematic form in FIGS. 1-13 serve explanatory purposes and are not precise, comprehensive depictions of actual structures, methods, and systems in accordance with the invention. Furthermore, the embodiments described herein are exemplary and are not intended to limit the scope of the invention, which is defined in the claims below. Embodiments in accordance with the invention are described below with reference mainly to systems and methods for ALD deposition onto a single 200 mm wafer substrate. It is understood that the invention is useful on larger or smaller scales, and that the dimensions and operating variables discussed below can be scaled up or down appropriately.

CRISP utilizing $O_3$ and $CH_4$ is illustrated in Equations 2 and 3:

$$2O_3 + CH_4 \rightarrow CO_2 + 4H + 2O_2 \text{ and} \qquad (2)$$

$$3O_3 + CH_4 \rightarrow CO_2 + 3H + OH + 3O_2. \qquad (3)$$

These chemical reactions are highly exothermic and are driven strongly at any given temperature. For example, the enthalpy of formation for the process $2O_3 + CH_4 \rightarrow CO_2$ is $\Delta_f H° = -604.3$ kJ/mole. On the other hand, the formation of free hydrogen atoms requires $\Delta_f H° = 218$ kJ/mole per atom. Therefore, on an inert surface, the reaction represented by Equation 2 will proceed to produce hydrogen molecules ($\Delta_f H° = 0$):

$$2O_3 + CH_4 \rightarrow CO_2 + 2H_2 + 2O_2. \qquad (4)$$

In one preferred embodiment in accordance with the invention, the CRISP method is implemented as an ALD step, for example, to react with a –ML terminated surface that is left following the completion of a $ML_x$ exposure step. In this case, the reactive species follow the thermodynamic path to react with the surface L species producing volatile HL by-products and terminating the surface with the most thermodynamically preferred species, for example, OH. Accordingly, the process is described by Equation 5:

$$3O_3 + CH_4 + \text{substrate–ML} \rightarrow CO_2 + \text{substrate–M–OH} + HL + H_2 + 3O_2. \qquad (5)$$

The enthalpy of formation of the CRISP ALD process represented by chemical Equation (5) is more exothermic, or more negative, than the enthalpy of the process represented by Equation 4, since the ALD part, substrate–ML+ $H_2O \rightarrow$ substrate–M–OH+HL, is exothermic. Although the kinetics of the ALD reaction with $H_2O$ is extremely slow at low temperature, the kinetics of the CRISP is fast and driven at any given temperature. Once the –ML surface is converted into –M–OH surface, the surface becomes inert for the particular CRISP process of Equations 2, 3, and 5, and the CRISP takes the path of Equation 4.

The ratio between $O_3$ and $CH_4$ affects the oxidizing conditions. Large $CH_4:O_3$ ratios are useful for suppressing the formation of OH (and to a lesser extent $H_2O$, $H_2O_2$) species. While it is not possible completely to avoid oxidizing conditions during growth of oxide films, tunability of oxidizing conditions is useful for achieving growth with minimized damage to sensitive substrates. Alternatively, depositing several layers of nitride films provides a continuous protective barrier over sensitive substrates without exposing the substrate to an oxidizing environment. For example, dimethylhydrazine ($C_2H_8N_2$) replaces $CH_4$ as a hydrocarbon catalyzing reactant. A CRISP method in accordance with the invention generates an intermediate reactive molecular fragment, such as H, NH, or $NH_2$, that is capable of converting an intermediate —ML surface into a —M-NH$_x$ surface for the growth of an ALD metal nitride films. For example:

$$4O_3 + C_2H_8N_2 + 2\text{substrate-ML} \rightarrow 2CO_2 + 2\text{substrate-M-NH} + 2HL + 3H_2 + 4O_2 \quad (6)$$

Nitridation is enhanced by using higher ratios of N:H in the CRISP process, for example, by adding CN gas. The driving force of this CRISP process is the formation of stable $CO_2$, and the kinetics far exceed the kinetics achieved with conventional reactants, such as $NH_3$ or $H_4N_2$.

FIG. 1 contains an exemplary process flow sheet of a method in accordance with the invention for deposition of AlN/Al$_2$O$_3$ on indium tin oxide (ITO). ITO represents a typical top surface layer of a top emitting OLED microdisplay device. Typically, the layers under an ITO film are sensitive to moisture and oxidizing conditions. Often, an ITO layer, typically deposited by sputtering, is not pinhole-free and does not provide adequate protection for the underlying sensitive layers. As a result, OLED devices often must be encapsulated by pinhole free films under mildly oxidizing and moisture free conditions. The process temperature cannot exceed 100° C. Usage of H$_2$O to facilitate the AH$_y$ ALD dose step is precluded by the moisture sensitivity of the substrate and by slow reaction kinetics (at 100° C. and below). FIG. 1 contains a process flow sheet of an ALD method 100 in accordance with the invention for depositing a thin protective layer of AlN without exposing the substrate to oxidizing conditions (processes 106-112). The resulting thin layer of AlN provides additional protection to the sensitive substrate. An AlN layer is deposited to a thickness that is adequate to protect sensitive OLED devices from the oxidizing conditions in processes 114-120 for growing an encapsulating Al$_2$O$_3$ film. Processes 102, 104 are utilized to activate the ITO substrate. This activation terminates the substrate with surface species that can react with the metal precursor and initiate continuous film growth.

In FIG. 1, the substrate top layer of ITO is first exposed to the CRISP process at a high CH$_4$:O$_3$ concentration ratio. In a preferred embodiment, a CH$_4$:O$_3$ concentration ratio of 10:1 is sufficiently high. Accordingly, CRISP stage 102 converts strained Sn—O—Sn, Sn—O—In and In—O—In bridges into surface hydroxyl species. For purposes of example, Equation 7 shows the above reaction with a strained In—O—Sn bridge taken as a representative example for an initial metoxane site (metal-O-metal bridge surface site):

$$\text{ITO-In-O-Sn-ITO} + 3O_3 + CH_4 \rightarrow \text{ITO-In-OH} + \text{ITO-Sn-OH} + CO_2 + 3O_2 + H_2^* \quad (7)$$

The CRISP catalyzing reaction is deactivated 104 for a short period of time by terminating the flow of O$_3$. The reactive hydroxylated intermediate ALD surface reacts in chemical dosage stage 106 with trimethylaluminum (TMA, Al(CH$_3$)$_3$), resulting in deposition of Al, a —CH$_3$-terminated surface, and a volatile CH$_4$ by-product. See Equation 8:

$$\text{ITO-In-OH} + \text{ITO-Sn-OH} + 2\text{Al}(CH_3)_3 \rightarrow \text{ITO-In-O-Al}(CH_3)_2 + \text{ITO-Sn—O—Al}(CH_3)_2 + 2CH_4^* \quad (8)$$

Excess TMA is removed during step 108 by inert gas purge. The —CH$_3$-terminated surface is further treated in CRISP stage 110 with catalyzing reactant mixture O$_3$/C$_2$H$_8$N$_2$ to deposit nitrogen terminated with hydrogen and produce a CH$_4$ volatile by-product (see Equation 9):

$$[-\text{Al}(CH_3)_2]_n + 2nO_3 + n/2\, C_2H_8N_2 \rightarrow \quad (9)$$
$$[-\text{AlNH}]_n + 2nCH_4 + nCO_2 + 2nO_2 + n/2\, H_2.$$

Following the completion of saturating CRISP stage 110 and deactivation 112, TMA reacts with the amine (—NH) terminated intermediate ALD surface in chemical dosage stage 106, as described in Equation 10. The sequence of Equations 9 and 10 is repeated to grow AlN.

$$[-\text{AlNH}]_n + n\text{Al}(CH_3)_3 \rightarrow [-\text{NAl}(CH_3)_2]_n + nCH_4. \quad (10)$$

Figure 2:
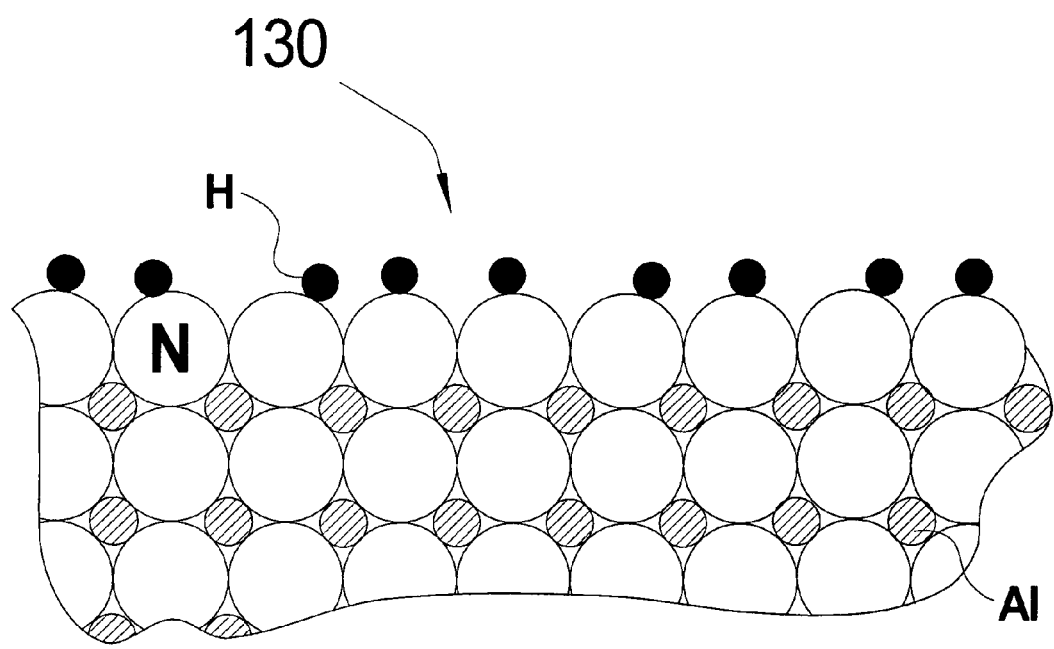
FIG. 2 depicts schematically an intermediate surface during a CRISP stage of an ALD process in accordance with the present invention for depositing AlN.

One of ordinary skill in the art appreciates that the terms in the square brackets in Equations 9 and 10 represent a surface polymeric chain, since the nitrogen that is incorporated into the film links surface Al atoms together with Al—N—Al bridges where the hydrogen is located on the bridging nitrogen atom. An illustration of the surface 130 created by these reactions is shown in FIG. 2.

In deactivation stage 112, the flow of O$_3$ is terminated for a short period of time sufficient for O$_3$ to decay and/or for the gas mixture of O$_3$/C$_2$H$_8$N$_2$ to be replaced by C$_2$H$_8$N$_2$ only. A relatively short deactivation 112 is usually sufficient and an inert gas purge is usually unnecessary. Steps 106-112 are repeated to deposit an AlN film with sufficient thickness to protect the sensitive device from the oxidizing conditions present in step 118.

Once a sufficient layer of AlN is deposited, the process flow proceeds with the deposition of Al$_2$O$_3$ following steps 114-120. TMA dosage stage 114 is performed, followed by inert gas purge stage 116. The —CH$_3$-terminated intermediate ALD surface is exposed to catalyzing reactant mixture O$_3$/CH$_4$ in CRISP stage 118, to convert —CH$_3$ surface species into —OH surface species, while producing CH$_4$ as volatile by-product. See Equations 11 and 12:

$$[-\text{Al}(CH_3)_2]_2 + 6O_3 + 2CH_4 \rightarrow \text{HO-Al-O-Al-OH} + 4CH_4 + 2CO_2 + H_2, \text{ and} \quad (11)$$

$$-\text{Al}-\text{OH} + \text{Al}(CH_3)_3 \rightarrow -\text{Al}-\text{O}-\text{Al}(CH_3)_2 + CH_4. \quad (12)$$

Subsequently, the flow of O$_3$ is terminated for a short period of time in deactivation stage 120 to deactivate the mixture of catalyzing CRISP reactants prior to the next TMA chemical dosage stage 114. The sequence of ALD stages 114-120 is repeated to grow the desired encapsulation layer thickness.

Alternative CRISP catalyzing reactions are used for AlN deposition. In an alternative process, hydride molecules, such as SiH$_4$ or B$_2$H$_6$, are used to supply intermediate reactive molecular fragment hydrogen, while a nitrogen fluoride compound, such as NF$_3$, F$_2$N or F$_2$N$_2$, supplies nitrogen for an intermediate reactive molecular fragment. This particular CRISP is extremely exothermic, being driven by the creation of volatile SiF$_4$ or BF$_3$, and provides ample amounts of adsorbed hydrogen and nitrogen. Since tin, indium or aluminum do not have volatile fluoride species, competition with possible fluorine etch paths does not exist, making the choice of catalyzing reactants and gas concentrations rather flexible. Since all the catalyzing reactants are stable molecules (unlike when O$_3$ is employed), such CRISP stages are conducted at low flow rates of catalyzing reactants to conserve usage of these chemicals and reduce emission of hazardous waste. An embodiment of an apparatus design suitable for conducting a CRISP stage using a low flow rate of a catalyzing reactant is described below with reference to FIG. 8.

Figure 3:
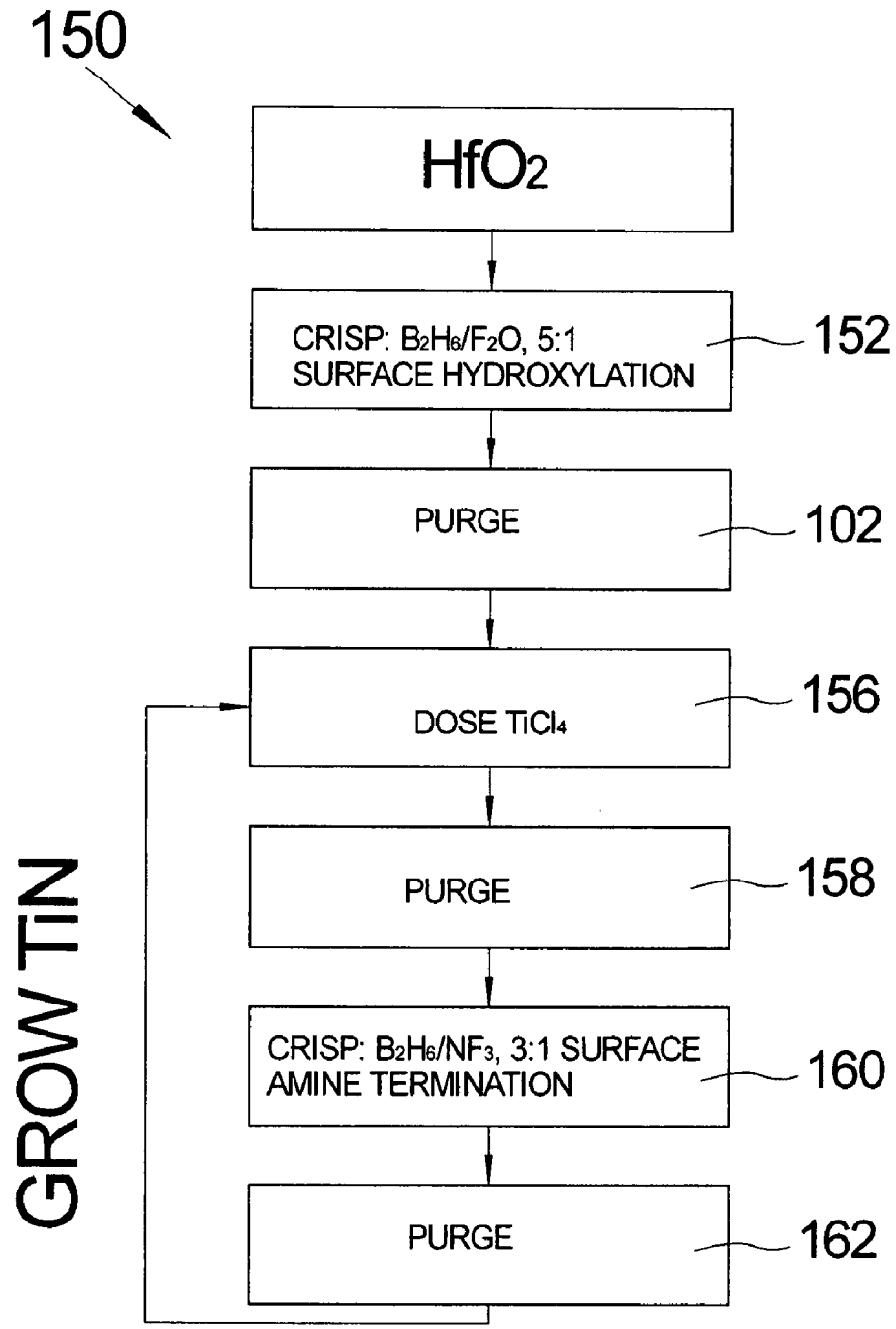
FIG. 3 contains a process flow sheet of a CRISP ALD process in accordance with the invention for deposition of TiN film over a $HfO_2$ substrate.

FIG. 3 depicts an exemplary process flow sheet of a method 150 in accordance with the invention for deposition of metal nitride, in particular, TiN, using an ALD cycle comprising sequential TiCl$_4$-dosage and B$_2$H$_6$/NF$_3$ CRISP stages. The metal precursor reaction is driven by generation of by-product HCl, and the catalyzing CRISP reaction is driven by generation of its volatile by-product, BF$_3$. In the exemplary method of FIG. 3, the TiN film is deposited over HfO$_2$, which requires hydroxylation to facilitate initial growth. The HfO$_2$ surface is activated by hydroxylation in CRISP stage 152 with a dilute catalyzing-reactant mixture B$_2$H$_6$/F$_2$O (see Equation 13):

$$Hf{-}O{-}Hf + B_2H_6 + 3F_2O \rightarrow 2Hf{-}OH + 2BF_3 + 2H_2O. \quad (13)$$

CRISP stage 152 is followed by a purge with inert gas in stage 154. The hydroxylated intermediate surface is exposed to metal precursor TiCl$_4$ in saturating chemical dosage stage 156 to deposit titanium and terminate the surface with chlorine (see Equation 14):

$$Hf{-}OH + TiCl_4 \rightarrow Hf{-}O{-}TiCl_3 + HCl. \quad (14)$$

The volatile by-product of this reaction is HCl. Following purge stage 158, the surface is exposed to saturating CRISP stage 160, to convert chlorine surface species into amine surface species and eliminate chlorine in HCl volatile by-product (see Equation 15):

$$[-TiCl_3]_n + nB_2H_6 + 2nNF_3 \rightarrow \quad (15)$$
$$[-TiNH]_n + 2BF_3 + nH_2 + nH_2 + n/2\,N_2 + 3nHCl.$$

Following a purge stage 162 to eliminate the CRISP reactants, the amine-terminated intermediate ALD surface reacts with TiCl$_4$ (repeat stage 156) in the next ALD cycle (see Equation 16):

$$[-TiNH]_n + nTiCl_4 \rightarrow [-TiN{-}TiCl_3]_n + nHCl. \quad (16)$$

The sequence 156-162 is repeated to grow TiN.

Fluorine-based chemistry is useful for oxide growth using CRISP. For example, SiH$_4$ is used with fluorine oxide molecules such as F$_2$O or F$_2$O$_2$ to replace H$_2$O in the deposition of oxide. Generation of SiF$_4$ volatile by-product makes these reactions extremely thermodynamically driven and efficient, enabling deposition of oxide films at low temperatures with a high SiH$_4$:F$_p$O$_q$ concentration ratio. The resulting mild oxidation conditions in this embodiment are useful for low temperature deposition on sensitive substrates, for example, during OLED fabrication.

Figure 4:
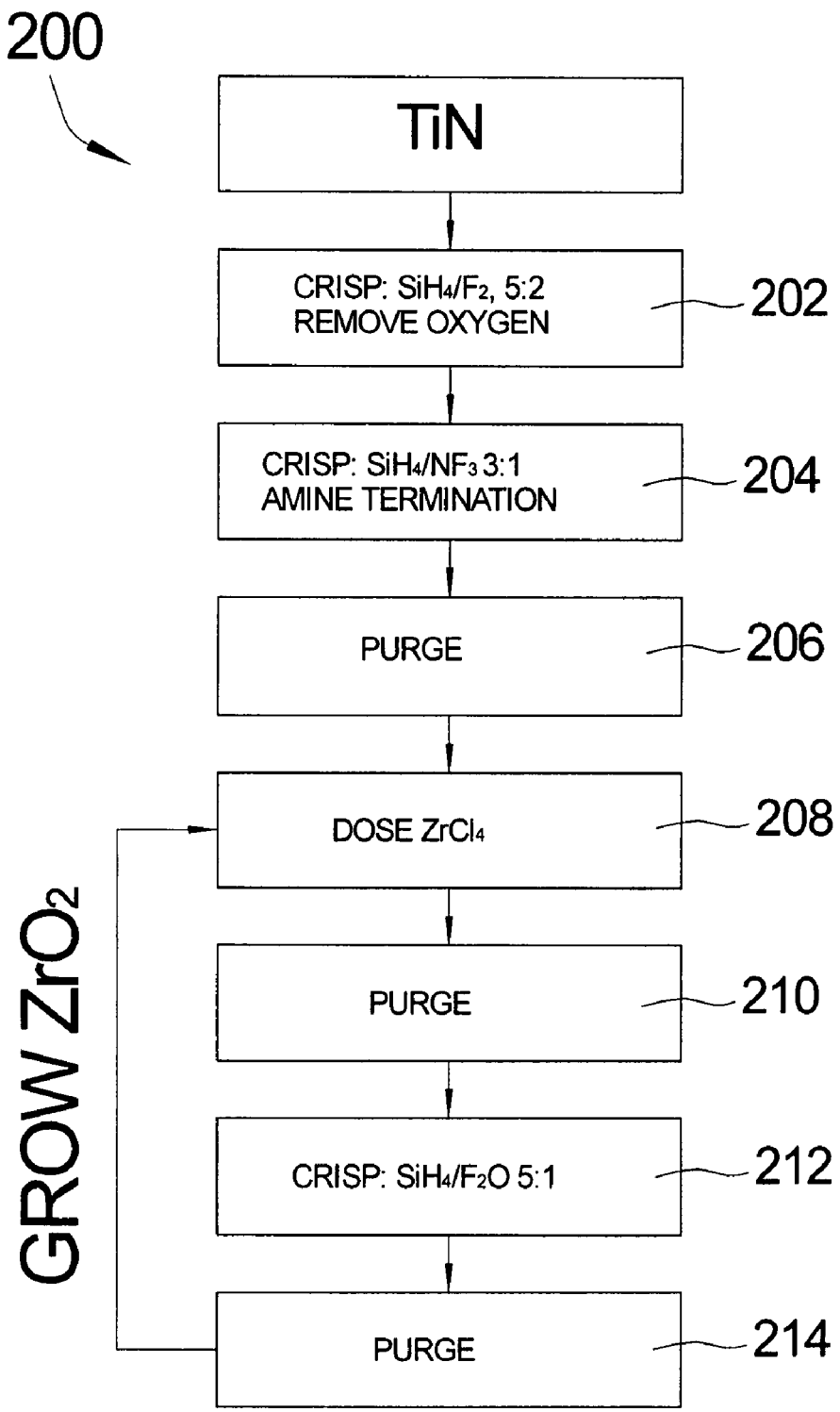
FIG. 4 contains a process flow sheet of a CRISP ALD process in accordance with the invention for deposition of $ZrO_2$ film over a TiN substrate.

FIG. 4 displays a process flow sheet of an exemplary method 200 in accordance with the invention for metal oxide deposition, namely, ZrO$_2$, using an ALD cycle comprising a saturating metal-precursor dosage stage including ZrCl$_4$ and a saturating CRISP stage including a catalyzing-reactant mixture SiH$_4$/F$_2$O. The saturating metal-precursor-surface reaction generates HCl by-product, and the catalyzing CRISP reaction is driven by volatilization of SiF$_4$. In method 200 of FIG. 4, the substrate is TiN and first CRISP stage 202 is used to reduce a native oxide TiO$_x$ surface and to remove residual carbon by hydrogen exposure. In CRISP stage 204, titanium is terminated with amine species in preparation for ZrO$_2$ growth. Following the inert gas purge stage 206, the amine-terminated intermediate ALD surface reactants with ZrCl$_4$ to deposit Zr and terminate the surface with chlorine species in metal-precursor chemical dosage stage 208. The metal-precursor-surface reaction is driven by the generation of volatile HCl. Following inert-gas purge stage 210, catalyzing-reactant mixture SiH$_4$/F$_2$O reacts with the chlorinated intermediate surface in saturating CRISP stage 212 and generates a hydroxylated intermediate surface. The reaction chamber is subsequently purged in purge stage 214. The sequence 208-214 is iterated to grow ZrO$_2$ film.

In other exemplary methods comprising CRISP ALD of silicon oxide or metal oxide films, a chemical dosage stage includes general metal precursors of the form M(OC$_p$H$_q$)$_r$, where M represents a metal or semiconductor atom, and a saturating CRISP stage includes an O$_3$/C$_s$H$_t$ catalyzing reactant mixture. For example, oxides of silicon or metal and the corresponding metal (or silicon) precursors are:

SiO$_2$: Si(OC$_2$H$_5$)$_4$ (tetraethoxysilane), Si(OCH$_3$)$_4$ (tetramethoxysilane);

Ta$_2$O$_5$: Ta(OC$_2$H$_5$)$_5$ (tantalum (V) ethoxide);

ZrO$_2$: Zr(OC$_2$H$_5$)$_4$ (zirconium (IV) ethoxide), Zr((OC(CH$_3$)$_3$)$_4$ (Zirconium t-butoxide; and HfO$_2$: Hf(OC$_2$H$_5$)$_4$ (hafnium (IV) ethoxide), Hf((OC(CH$_3$)$_3$)$_4$ (Hafnium t-butoxide).

The above precursors are used in combination with CRISP stages including catalyzing reactants such as O$_3$/CH$_4$ or O$_3$/C$_2$H$_2$.

The following are some general equations for an exemplary process:

$$\text{substrate} - OH + M(OC_pH_q)_r \rightarrow$$
$$\text{substrate} - O - M(OC_pH_q)_{r-1} + C_pH_qOH,$$

and $$\text{substrate} - O - M - OC_pH_q + O_3 + \tfrac{1}{2}CH_4 \rightarrow$$
$$\text{Substrate} - O - M - OH + C_pH_{q+1} + O_2 + \tfrac{1}{2}CO_2.$$

For simplicity, the second equation illustrates the process of hydroxylating a single —OC$_p$H$_q$ group.

SPECIFIC EXAMPLES

SiO$_2$:

$$\text{substrate} - OH + Si(OC_2H_5)_4 \rightarrow \text{substarte} - O - Si(OC_2H_5)_3 + C_2H_5OH,$$

and $$\text{substrate} - O - Si - OC_2H_5 + O_3 + \tfrac{1}{2}CH_4 \rightarrow$$
$$\text{Substrate} - O - Si - OH + C_2H_6 + O_2 + \tfrac{1}{2}CO_2.$$

It should be understood that the "OH" surface species in the second equation represents three such surface species that are formed on the surface. Since generally there are three alkoxy groups for each silicon atom on the surface, O$_3$/CH$_4$ CRISP stage generates three surface —OH species. Two of these —OH species react with other —OH species from other —Si(OH)$_3$ to form water and Si—O—Si (siloxane) bridges. The siloxane bridges create the SiO$_2$ bulk network bonding. The water molecules are drawn off as water vapor. Volatile surface by-products of the fragment-surface reaction include ethanol (C$_2$H$_5$OH) and ethane (C$_2$H$_6$).

SiO$_2$:

$$\text{substrate} - \text{OH} + \text{Si(OCH}_3)_4 \rightarrow \text{substrate} - \text{O} - \text{Si(OCH}_3)_3 + \text{CH}_3\text{OH},$$

and $$\text{substrate} - \text{O} - \text{Si} - \text{OCH}_3 + \text{O}_3 + \frac{1}{2}\text{CH}_4 \rightarrow$$

$$\text{Substrate} - \text{O} - \text{Si} - \text{OH} + \text{CH}_4 + \text{O}_2 + \frac{1}{2}\text{CO}_2.$$

Ta$_2$O$_5$:

$$\text{substrate} - \text{OH} + \text{Ta(OC}_2\text{H}_5)_5 \rightarrow$$
$$\text{substrate} - \text{O} - \text{Ta(OC}_2\text{H}_5)_4 + \text{C}_2\text{H}_5\text{OH},$$

and $$\text{substrate} - \text{O} - \text{Ta} - \text{OC}_2\text{H}_5 + \text{O}_3 + \frac{1}{2}\text{CH}_4 \rightarrow$$

$$\text{Substrate} - \text{O} - \text{Ta} - \text{OH} + \text{C}_2\text{H}_6 + \text{O}_2 + \frac{1}{2}\text{CO}_2.$$

The possible reaction by-products also include ethanol, as well as ethane.

ZrO$_2$:

$$\text{substrate} - \text{OH} + \text{Zr(OC}_2\text{H}_5)_4 \rightarrow \text{substrate} - \text{O} - \text{Zr(OC}_2\text{H}_5)_3 + \text{C}_2\text{H}_5\text{OH},$$

and $$\text{substrate} - \text{O} - \text{Zr} - \text{OC}_2\text{H}_5 + \text{O}_3 + \frac{1}{2}\text{CH}_4 \rightarrow$$

$$\text{Substrate} - \text{O} - \text{Zr} - \text{OH} + \text{C}_2\text{H}_6 + \text{O}_2 + \frac{1}{2}\text{CO}_2.$$

The possible reaction by-products also include ethanol.

HfO$_2$:

$$\text{substrate} - \text{OH} + \text{Hf(OC}_2\text{H}_5)_4 \rightarrow$$
$$\text{substrate} - \text{O} - \text{Hf(OC}_2\text{H}_5)_3 + \text{C}_2\text{H}_5\text{OH},$$

and $$\text{substrate} - \text{O} - \text{Hf} - \text{OC}_2\text{H}_5 + \text{O}_3 + \frac{1}{2}\text{CH}_4 \rightarrow$$

$$\text{Substrate} - \text{O} - \text{Hf} - \text{OH} + \text{C}_2\text{H}_6 + \text{O}_2 + \frac{1}{2}\text{CO}_2.$$

The possible reaction by-products also include ethanol.

It is useful to represent such processes with three equations. For example:

SiO$_2$:

$$\text{substrate} - \text{OH} + \text{Si(OC}_2\text{H}_5)_4 \rightarrow \text{substrate} - \text{O} - \text{Si(OC}_2\text{H}_5)_3 + \text{C}_2\text{H}_5\text{OH},$$

$$[\text{substrate} - \text{O} - \text{Si}(-\text{OC}_2\text{H}_5)_3]_n + 3n\text{O}_3 + \frac{3n}{2}\text{CH}_4 \rightarrow$$

$$[\text{Substrate} - \text{O} - \text{Si}(-\text{OH})_3]_n + 3n\text{C}_2\text{H}_6 + 3n\text{O}_2 + \frac{3n}{2}\text{CO}_2,$$

and $$[\text{Substrate} - \text{O} - \text{Si}(-\text{OH})_3]_n \rightarrow$$
$$[\text{Substrate} - \text{O} - \text{Si}(-\text{O}-)_2 - \text{OH}]_n + 2n\text{H}_2\text{O},$$

where the third equation in the set represents the process of condensation that creates the cross-linking bonds of the SiO$_2$ film. Two cross-linking bonds are generated per silicon atom derived from the tetraethoxysilane. It should be understood that the process described above is actually a three-dimensional process.

The exemplary methods described herein illustrate an important characteristic of CRISP: instead of conducting a saturating reaction with molecules, which results in slow processes, catalyzing reactants react in a catalyzing CRISP reaction to generate one or more intermediate reactive molecular fragments, and the fragment or fragments react more quickly at an intermediate surface.

An ALD method in accordance with the invention is suitable for depositing a wide variety of metal-containing (and semiconductor-atom-containing) layers on the surface of a substrate. For example, an ALD method for depositing a layer containing TiN includes the metal precursor TiCl$_4$ in the saturating chemical dosage stage, and a first catalyzing reactant SiH$_4$ and a second catalyzing reactant NF$_3$ in the saturating CRISP stage. Another example is an ALD method for depositing a layer comprising a ZrO$_2$ ALD film in which the metal precursor in the saturating chemical dosage stage is selected from a group including ZrCl$_4$ and Zr(O-t-C$_4$H$_9$)$_4$, a first catalyzing reactant in the saturating CRISP stage is selected from a group including O$_3$ and B$_2$H$_6$, and a second catalyzing reactant in the saturating CRISP stage is selected from a group including C$_2$H$_4$, C$_8$H$_{10}$, CH$_3$OH, C$_2$H$_5$OH, i-C$_3$H$_7$OH, t-C$_4$H$_9$OH, and F$_2$O. A further example is an ALD method for depositing a layer comprising a HfO$_2$ ALD film in which the metal precursor in the saturating chemical dosage stage is selected from a group including HfCl$_4$ and Hf(O-t-C$_4$H$_9$)$_4$, a first catalyzing reactant in the saturating CRISP stage is selected from a group including O$_3$ and B$_2$H$_6$, and a second catalyzing reactant in the saturating CRISP stage is selected from a group including C$_2$H$_4$, C$_8$H$_{10}$, CH$_3$OH, C$_2$H$_5$OH, i-C$_3$H$_7$OH, t-C$_4$H$_9$OH, and F$_2$O. A further example is an ALD method for depositing a layer comprising a SiO$_2$ ALD in which the metal precursor in the saturating chemical dosage stage is selected from a group including Si(OC$_2$O$_5$)$_4$, SiCl$_4$, and SiH$_2$Cl$_2$, a first catalyzing reactant in the saturating CRISP stage is selected from a group including O$_3$ and B$_2$H$_6$, and a second catalyzing reactant in the saturating CRISP stage is selected from a group including C$_2$H$_4$, C$_8$H$_{10}$, CH$_3$OH, C$_2$H$_5$OH, i-C$_3$H$_7$OH, t-C$_4$H$_9$OH, and F$_2$O.

A further example is an ALD method for depositing a layer comprising a Ta$_2$O$_5$ ALD film in which the metal precursor in the saturating chemical dosage stage is selected from a group including Ta(OC$_2$O$_5$)$_5$ and TaCl$_5$, a first catalyzing reactant in the saturating CRISP stage is selected from a group including O$_3$ and B$_2$H$_6$, and a second catalyzing reactant in the saturating CRISP stage is selected from a group including C$_2$H$_4$, C$_8$H$_{10}$, CH$_3$OH, C$_2$H$_5$OH, i-C$_3$H$_7$OH, t-C$_4$H$_9$OH, and F$_2$O.

A further example is an ALD method for depositing a layer comprising a copper ALD film in which the metal precursor in the saturating chemical dosage stage is selected from a group including Cu(tfac)$_2$ and Cu(hfac)$_2$, a first catalyzing reactant in the saturating CRISP stage is selected from a group including $SiH_4$, $SiH_2Cl_2$, $B_2H_6$, $Si_2H_6$, $C_8H_{10}$, and $CH_3OH$, and a second catalyzing reactant in the saturating CRISP stage is selected from a group including $F_2$, $F_2O$, $NF_3$, $ClF_3$, and $O_3$.

A further example is an ALD method for depositing a layer comprising a W ALD film in which the metal precursor in the saturating chemical dosage stage is selected from a group including $WF_6$ and $WCl_6$, a first catalyzing reactant in the saturating CRISP stage is selected from a group including $SiH_4$, $SiH_2Cl_2$, $B_2H_6$, $Si_2H_6$, $C_8H_{10}$, and $CH_3OH$, and a second catalyzing reactant in the saturating CRISP stage is selected from a group including $F_2$, $F_2O$, $NF_3$, $ClF_3$, and $O_3$.

A further example is an ALD method for depositing a layer comprising a Mo ALD film in which the metal precursor in the saturating chemical dosage stage is selected from a group including $MoCl_5$, a first catalyzing reactant in the saturating CRISP stage is selected from a group including $SiH_4$, $SiH_2Cl_2$, $B_2H_6$, $Si_2H_6$, $C_8H_{10}$, and $CH_3OH$, and a second catalyzing reactant in the saturating CRISP stage is selected from a group including $F_2$, $F_2O$, $NF_3$, $ClF_3$, and $O_3$.

A further example is an ALD method for depositing a layer comprising a Si ALD film in which the metal precursor in the saturating chemical dosage stage is selected from a group including $Si(OC_2H_5)_5$, $SiH_2Cl_2$, $SiCl_4$, $SiH_4$, and $SiHCl_3$, a first catalyzing reactant in the saturating CRISP stage is selected from a group including $SiH_4$, $SiH_2Cl_2$, $B_2H_6$, $Si_2H_6$, $C_8H_{10}$, and $CH_3OH$, and a second catalyzing reactant in the saturating CRISP stage is selected from a group including $F_2$, $F_2O$, $NF_3$, $ClF_3$, and $O_3$.

A further example is an ALD method for depositing a layer comprising aluminum oxide ($Al_2O_3$) in which a metal precursor in the saturating chemical dosage stage comprises trimethylaluminum, a first catalyzing reactant in the saturating CRISP stage comprises ozone ($O_3$), and a second catalyzing reactant in the saturating CRISP stage comprises a hydrocarbon molecule selected from a group including methane ($CH_4$), $C_2H_6$, $C_2H_4$, and $C_8H_6$.

A further example is an ALD method for depositing a layer comprising aluminum oxide ($Al_2O_3$) in which a metal precursor in the saturating chemical dosage stage comprises trimethylaluminum, a first catalyzing reactant in the saturating CRISP stage comprises ozone ($O_3$), and a second catalyzing reactant in the saturating CRISP stage comprises an alcohol molecule.

Figure 5:
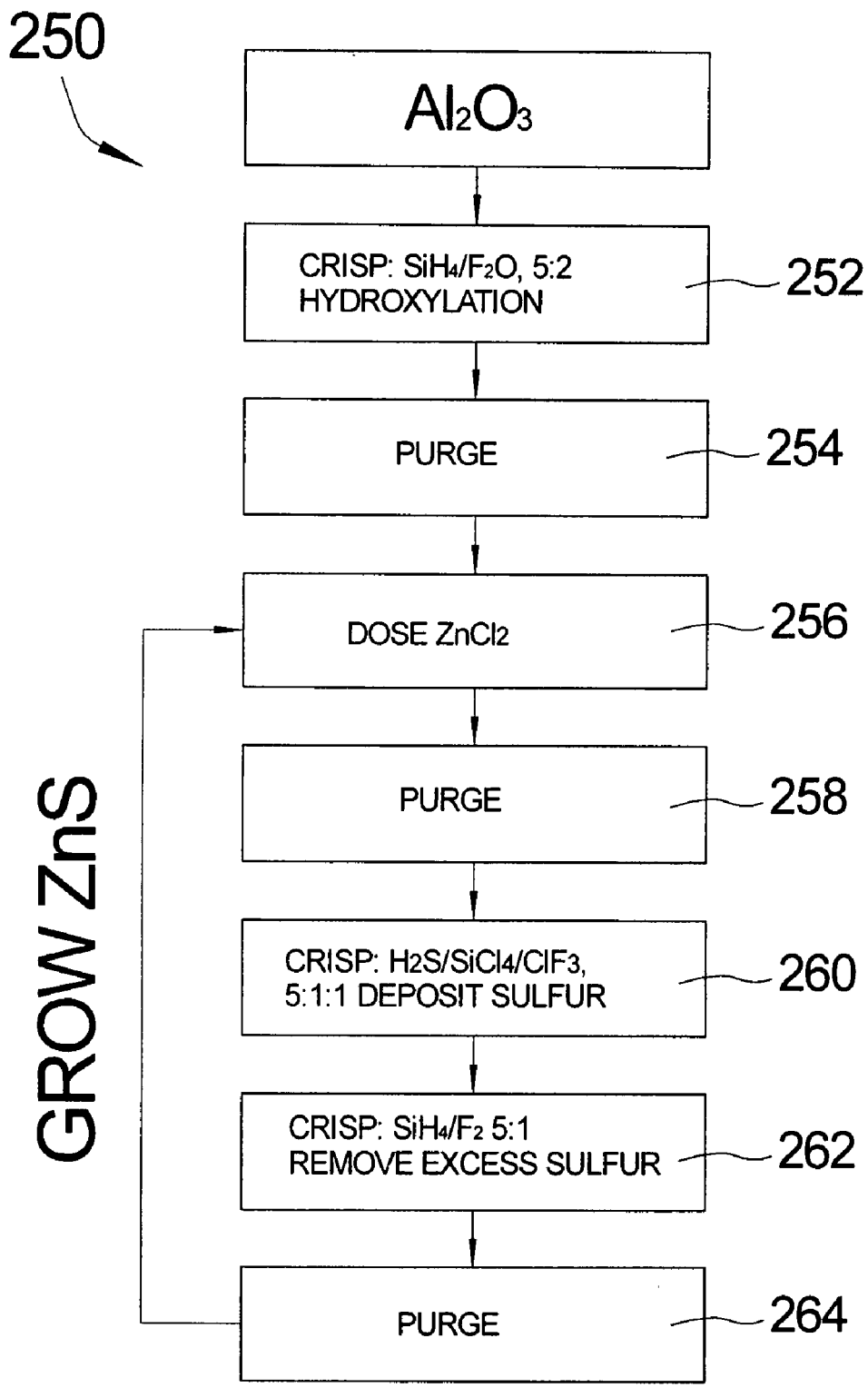
FIG. 5 contains a process flow sheet of a CRISP ALD process in accordance with the invention for deposition of a ZnS film over an $Al_2O_3$ substrate.

As another example, a CRISP method is useful to deposit sulfide films. For example, an $H_2S$ reaction is catalyzed by a CRISP-generated chlorine fragment to promote deposition of sulfur. Subsequently, a CRISP reducing stage is utilized to remove excessive sulfur down to a single layer that is terminated with hydrogen. Chlorine is provided by mixing catalyzing reactants $H_2S$ and $SCl_2$, or by the CRISP mixture of a catalyzing chloride reactant, such as $SiCl_4$, and a fluorine-containing catalyzing reactant, such as $ClF_3$. The catalyzing CRISP reactants accelerate (or catalyze) completion of a potentially slow process, such as the reaction of molecular $H_2S$ with chlorine-terminated surfaces, by reacting in a catalyzing reaction to generate one or more intermediate reactive molecular fragments. FIG. 5 contains a process flow sheet of an exemplary method 250 in accordance with the invention for depositing ZnS. Similar methods are useful for depositing other compound materials, such as ZnSe. In exemplary method 250, a substrate comprising $Al_2O_3$ is hydroxylated in CRISP stage 252 using catalyzing reactants $SiH_4$ and $F_2O$. After purge stage 254, metal precursor $ZnCl_2$ is introduced into the reaction chamber in chemical dosage stage 256 to deposit Zn on the substrate surface. After purge stage 258, a sequence of catalyzing reactions is conducted by varying the flow rates of catalyzing reactants during CRISP stage 260/262. In substage 260, catalyzing reactants $H_2S$, $SiCl_4$ and $ClF_3$ are introduced into the reaction chamber in a flow rate ratio of approximately 5:1:1 to deposit sulfur. In substage 262, excess sulfur is removed by introducing $SiH_4$ and $F_2$ into the reaction chamber in a flow rate ratio of approximately 5:1. The result of sequence 260/262 is a cascade of fragment-surface reactions resulting in an intermediate ALD surface that reacts with the metal precursor $ZnCl_2$ in chemical dosage stage 256 after purge stage 264. An example of the flexibility of a method including CRISP in accordance with the invention is that, while the catalyzing reactions and resulting fragment-surface reactions of substages 260 and 262 occur sequentially, a similar catalyzing effect may be achieved by combining substages 260 and 262 into a single catalyzing reaction comprising $H_2S$, $SiH_4$, and $ClF_3$.

In another aspect, an ALD CRISP process includes conducting an initial ALD cycle and further ALD cycles, wherein conducting the initial ALD cycle comprises: introducing a metal ALD precursor that reacts with an initial ALD surface in an initial saturating metal precursor-surface reaction to deposit a metal atom on the substrate, and the metal precursor-surface reaction generates a first intermediate ALD surface that contains a ligand of the metal ALD precursor; and wherein conducting the initial ALD cycle further includes conducting an initial saturating CRISP stage in which an intermediate reactive molecular fragment comprising atomic hydrogen reacts with the first intermediate ALD surface in an initial saturating fragment-surface reaction, and the initial saturating fragment-surface reaction generates a volatile surface by-product containing a hydrated form of the metal precursor ligand, thereby removing the metal precursor ligand from the substrate, and the initial saturating fragment-surface reaction terminates the metal with hydrogen, thereby generating a second intermediate ALD surface; and wherein conducting a further ALD cycle comprises: introducing a metal ALD precursor that reacts with the hydrogen in the second intermediate ALD surface in a saturating metal-surface reaction to deposit a metal atom on the substrate, and the metal-surface reaction generates the first intermediate ALD surface, and the first intermediate ALD surface comprises a ligand of the metal ALD precursor; and wherein conducting a further ALD cycle includes conducting a CRISP stage in which an intermediate reactive molecular fragment comprising atomic hydrogen reacts with the first intermediate ALD surface in a saturating fragment-surface reaction, and the saturating fragment-surface reaction generates a volatile surface by-product containing a hydrated form of the metal precursor ligand, thereby removing the metal precursor ligand from the substrate, and the saturating fragment-surface reaction terminates the metal with hydrogen, thereby generating a second intermediate ALD surface.

FIG. 6A depicts a conventional ALD process using conventional $H_2O$ exposure. FIG. 6B depicts a saturating CRISP stage in an ALD method in accordance with the invention. In both FIGS. 6A and 6B, a surface terminated with –MCl is converted into –MOH, and the process is driven by the release of volatile HCl by-product. In FIG. 6A, the kinetics of the conventional process are dictated by several high-barrier factors. The surface 302 is exposed to $H_2O$ and the first limiting factor is adsorption of $H_2O$ over a surface terminated with Cl. This adsorption process 305 is not efficient and creates a mediating adsorption state with bond strength in the order of $E_a$~20 kJ/mole. The adsorption does not greatly affect either the M—Cl or the H—OH bond strengths. Simultaneous breakage of these bonds is required to induce the ALD reaction. Accordingly, the barrier for the conventional ALD reaction 310 shown in FIG. 6A is high (empirically typically higher than $E_r \sim 100$ kJ/mole). Consequently, most adsorbed $H_2O$ molecules desorb from the surface and only a very small fraction reacts. The fraction of adsorbed molecules that reacts scales exponentially with $(E_a-E_r)/RT$. Accordingly, the combined process is highly thermally activated. Typically, $AH_y$ reactions slow down more than three orders of magnitude when the temperature is reduced from 300° C. to 100° C.

In contrast, a CRISP stage is much less temperature dependent. As shown in FIG. 6B, instead of $H_2O$, a continuous, non-saturating catalyzing CRISP reaction generates a volatile by-product (not shown) and intermediate reactive molecular fragments OH and H that react with the intermediate MCl-terminated surface 322 in fragment-surface reactions 325, 330. Hydrogen atoms adsorb strongly on the chlorine sites making the metal-chlorine bond weaker. The OH species attach strongly to the metal atoms and further weaken the metal-chlorine bond. As a result, adsorption and reaction energies are similar, $E_a \sim E_r$. Accordingly, the reaction path produces desired intermediate ALD surface 330 at speeds orders of magnitude faster than in conventional ALD. Furthermore, the CRISP process 325, 330 is less temperature dependent.

Most common metal precursors adsorb on –AH terminated surfaces with an adsorption energy of 20 kJ/mole to 30 kJ/mole. The barrier for surface reaction is on the order of 40 kJ/mole to 60 kJ/mole. Thus, the fraction of adsorbed molecules that reacts in a metal-precursor surface reaction corresponding to the process of FIG. 6A is substantially higher than in the case of conventional $AH_y$ precursors, and the temperature-dependence of the metal-precursor reaction is not as strong. Therefore, reaction rates at 300° C. are typically orders of magnitude faster than reaction rates of conventional nonmetal precursors. Reaction rates of metal precursors typically slow down by a factor of only about 10 when the process temperature is reduced from 300° C. to 100° C.

The reaction temperature of a fabrication method is typically dictated by the application, such as in the case of encapsulation layers for OLED displays. The thermal stability of surface species is also a consideration. The coverage and stability of –AH species is important, since it has been determined to be a major factor affecting the amount of material deposited per ALD cycle in certain ALD processes. AH species, such as OH, NH, $NH_2$, and SH, typically desorb by a condensation mechanism. For example, surface OH species can produce one volatile $H_2O$ molecule and one surface M—O—M bridge site per two OH species. Thermodynamics dictate that, at any given temperature, the lowest surface energy determines a given coverage of OH species. This coverage is stable and decays relatively slowly on the time scale of the ALD process. Therefore, intermediate OH-covered surfaces perform substantially ideally in ALD.

Similarly, amine-terminated surfaces, –NH and $–NH_2$, exhibit substantial stability that enables ALD with close to ideal characteristics. Nevertheless, growth per cycle of nitride films is rather small, typically on the order of 10% of a monolayer in the typical temperature range of from 250° C. to 450° C., indicating that surface-stabilization of amine species is substantially smaller than that of OH species.

Hydrogen terminations on elemental films from Group IVB (Si, C, Sn, Pb, Ge) are rather stable under typical processing temperatures in a range of 200° C. to 450° C. Similarly, hydrogen-termination on intermediate nonmetal surfaces of GaAs, InP, and other 3-5 and 2-6 type compound semiconductors are relatively stable. Hydrogen termination on metal surfaces vary in stability, but desorb rapidly at temperatures higher than 100° C.

Therefore, the stability of hydrogen species limits metal ALD methods to relatively low temperatures. For example, in Equation 17, hydrogen desorption from copper surfaces follows a second order kinetics:

$$\frac{d\theta}{dt} = -k\theta^2 \approx -3 \times 10^{11} \exp\left(-\frac{9300}{T}\right), \quad (17)$$

where $0 \leq \theta \leq 1$ is the coverage of hydrogen relative to a fully covered surface of $\sim 1.5 \times 10^{15}$ H/cm$^2$, and k is the second order desorption rate. Accordingly, hydrogen desorption is a concern during typical ALD purge and dosage times at temperatures higher than 30° C. For example, at 80° C., an estimated ~10% desorption of surface hydrogen will occur during a minimal 200 msec time period following a CRISP stage. Therefore, ALD of copper is generally restricted to very low temperatures. Certain compromises of ALD ideality are tolerable to extend the temperature range. Nevertheless, in the case of copper, this extension can hardly go beyond 100° C. Other metals of practical importance, such as Al, Ti, W, Mo, and Ta, require ALD deposition below 150° C.

ALD metal deposition carried at high temperatures (>200° C.) using a conventional, prior-art technique results in complete desorption of hydrogen within time periods of about 10 msec, which practically exposes bare metal surfaces. In a subsequent dosage of metal precursor, a typical metal precursor is capable of irreversible dissociative chemisorption on the exposed metal surface. Dissociative chemisorption over metallic surfaces, however, typically does not self terminate. In particular, exposing bare metallic surfaces to metal halide precursors typically results in continuous growth of metal (and thereby in the formation of undesired porous films). In addition, bare metal surfaces are extremely sensitive to contamination from residual gas in an ALD apparatus.

Figure 7:
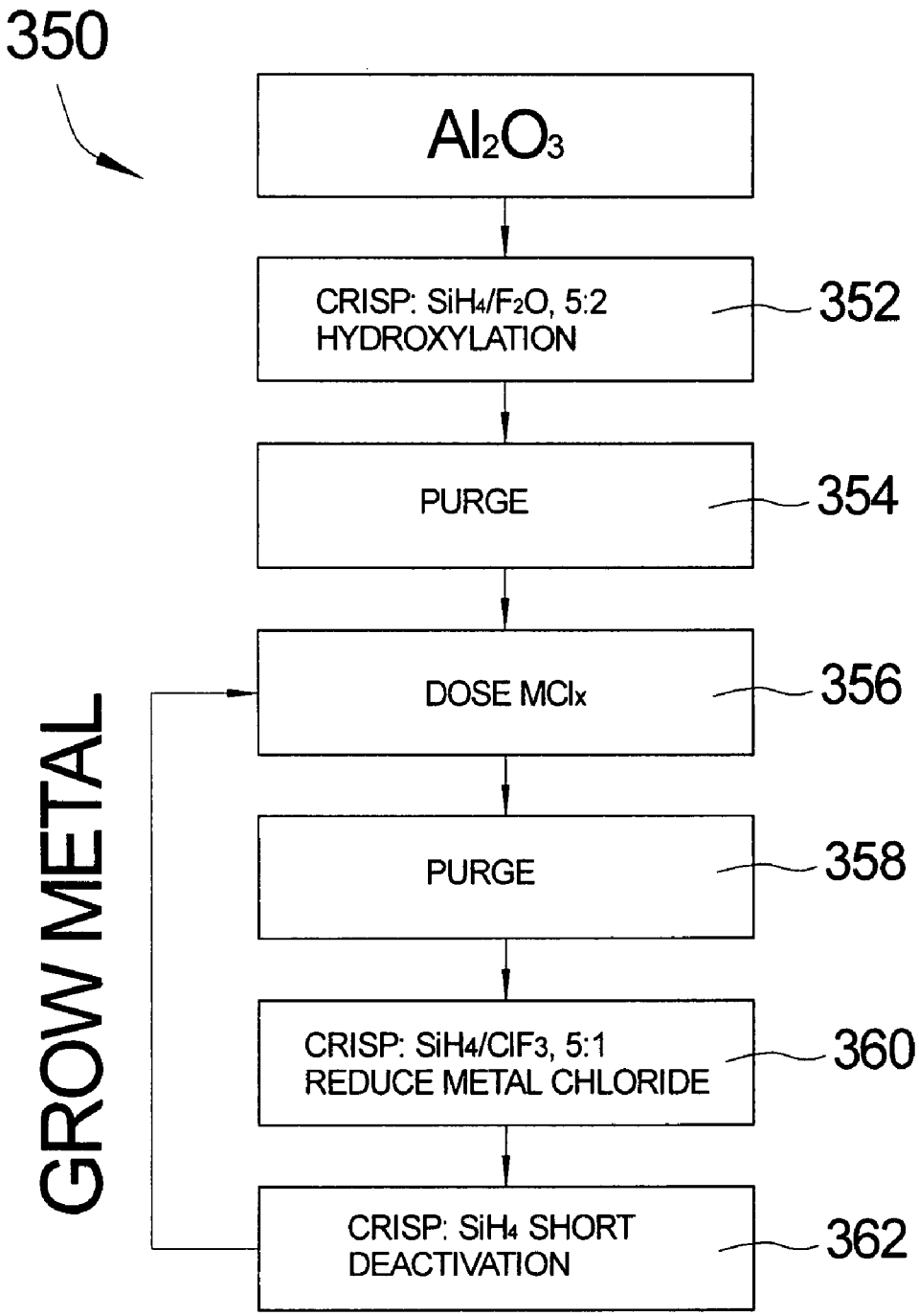
FIG. 7 contains a process flow sheet of a CRISP ALD process in accordance with the invention for deposition of a metal film over an $Al_2O_3$ substrate.

An advantage of a CRISP ALD method is that a CRISP stage suitable for generating intermediate reactive hydrogen adsorbate can be conducted at a low temperature, for example, less than 100° C., thereby avoiding the problem of hydrogen desorption characteristic of high-temperature ALD of the prior art. FIG. 7 contains a process flow sheet of an exemplary method 350 for depositing metal in a sequence of ML exposures, followed by a hydrogen-generating CRISP stage. In method 350, $Al_2O_3$ is hydroxylated in CRISP stage 352, and after purge 354, exposed to a metal chloride precursor in chemical dosage stage 356. Following purge stage 358, the chlorine species are reduced using $SiH_4/ClF_3$ catalyzing reactant mixture in CRISP stage 360. Following a short deactivation stage 362, the ALD cycle comprising stages 356-362 is repeated to grow metal film.

CRISP is also useful for preparing substrates for ALD. Both substrate cleaning and activation require a well-controlled supply of reactive atomic or molecular fragments on the surface. Unlike plasma techniques, where efficient supply of these reactive species to the surface without damaging the substrate is difficult and typically not practical, CRISP generates ample amounts of these reactive fragments on the surface. CRISP also has the advantage that free reactive radical species are not actually generated. Instead, catalyzing reactants react in a continuous, non-saturating catalyzing reaction to generate adsorbate atomic or molecular fragments, which are capable of self-elimination by recombination when the surface has reached a passivation point. A passivation point is specific for a specific process and is, for example, the point of clean and hydrogen-terminated surface of semiconductor when a CRISP method is utilized to remove native oxide, carbon, and some metallic impurities from a semiconductor surface. A CRISP stage does not actually generate free radical species. Also, controlling the ratios of catalyzing reactants provides flexible control of CRISP catalyzing reactions and subsequent fragment-surface reactions. As a result, certain CRISP techniques are flexibly controlled to achieve activation of metal and semiconductor surfaces without oxidizing or nitridizing the bulk of the substrate. In contrast, plasma-induced processes and other processes that use atomic or radical species, as well as activation processes performed in liquids, typically cause undesired reactions in the bulk of the substrate.

A CRISP method in accordance with the invention is useful in a variety of various surface treatment processes. A surface preparation method having a saturating CRISP includes introducing a plurality of catalyzing reactants into a reaction chamber containing a substrate with a surface, in which the catalyzing reactants react in a continuous and non-saturating catalyzing reaction, the catalyzing reaction generates a volatile by-product and an intermediate reactive molecular fragment, and the intermediate reactive molecular fragment reacts with the surface in a substantially saturating fragment-surface reaction. The CRISP stage in a surface preparation method generally includes introducing a first catalyzing reactant into the reaction chamber, and introducing a second catalyzing reactant into the reaction chamber.

A CRISP method is also utilized in a process for cleaning a semiconductor surface. An example of a CRISP cleaning method includes exposing the surface to a hydride/fluoride mixture of catalyzing reactants to generate hydrogen adsorbate on the surface, which hydrogen adsorbate volatilizes an atom on the surface. Typically, the volatilized surface atom is from a group including O, N, C, Sn, and Al on the surface. Typically, the substrate comprises silicon or germanium and a native oxide or nitride film is removed, and silicon or germanium from the oxide or nitride films is volatilized as $SiH_4$ or $GeH_4$, whereby the surface is smoothed and becomes terminated with hydrogen. Examples of combinations of catalyzing reactants for substrate cleaning include $SiH_4/F_2$, $B_2H_6/F_2$, $Si_2H_6/F_2$, $SiH_2Cl_2/F_2$, $PH_3/F_2$, $SiH_4/ClF_3$, $B_2H_6/ClF_3$, $Si_2H_6/ClF_3$, $SiH_2Cl_2/ClF_3$, $PH_3/ClF_3$, $SiH_4/HF$, $B_2H_6/HF$, $Si_2H_6/HF$, $SiH_2Cl_2/HF$, and $PH_3/HF$. In another aspect, in a CRISP cleaning process, the substrate typically contains a contamination atom, and the fragment-surface reaction generates a volatile surface by-product molecule containing the contamination atom, thereby removing the contamination atom from the surface. Frequently, the substrate contains metallic contamination, and the fragment-surface reaction generates a volatile surface by-product molecule containing the metallic contamination, thereby removing the metallic contamination from the surface. In another aspect, the intermediate reactive molecular fragment terminates the surface after the fragment-surface reaction of a cleaning method. In another aspect, the fragment-surface reaction saturates when the surface no longer contains contamination atoms.

In certain embodiments, a surface preparation method utilizing CRISP includes: introducing a first plurality of the catalyzing reactants, which react in a first continuous and non-saturating catalyzing reaction under a first set of reaction conditions that generates a first volatile by-product and a first intermediate reactive molecular fragment. In another aspect, the first intermediate reactive molecular fragment then reacts with the surface in a first fragment-surface reaction that generates a volatile surface by-product molecule containing a contamination atom, thereby removing the contamination atom from the surface. The method then includes introducing a second plurality of the catalyzing reactants, which react in a second continuous and non-saturating catalyzing reaction under a second set of reaction conditions that generates a second volatile by-product and a second intermediate reactive molecular fragment, and the second intermediate reactive molecular fragment reacts with the surface in a second fragment-surface reaction, thereby terminating the surface. In another aspect, removing the contamination atom and the terminating of the surface are conducted beyond saturation. Frequently, the contamination atom comprises an atom selected from a group including Al, Si, O, N, S, Se, and Sn. In another aspect, the substrate in a cleaning process is terminated by an intermediate reactive molecular fragment selected from a group including OH, NH, $NH_2$, SH, SeH, AsH, and $AsH_2$.

A CRISP method in a surface preparation of process is also utilized for initiating ALD growth by introducing a metal ALD precursor into the reaction chamber, in which the metal ALD precursor reacts with the surface terminated with an intermediate reactive molecular fragment.

The intermediate reactive molecular fragment in a surface preparation process frequently comprises atomic hydrogen. In addition, the catalyzing reaction frequently generates a plurality of intermediate reactive molecular fragments, typically comprising a hydrogen atom and molecular fragments selected from a group including OH, NH, $NH_2$, SH, SeH, AsH, and $AsH_2$. Similar to ALD CRISP methods, controlling a flow rate ratio of the catalyzing reactants into the reaction chamber serves to control relative surface concentrations of the hydrogen atoms and the molecular fragments. Examples of CRISP surface preparation processes include a first type of catalyzing reactants and a second type of catalyzing reactants, the catalyzing reactants including a first reactant type selected from a group including $O_3$, $F_2$, $NF_3$, $ClF_3$, HF, $F_2O$, FI, FNO, $N_2F_2$, $F_2O_2$, and $F_4N_2$, and a second reactant type selected from a group including $CH_4$, CN, $C_2H_8N_2$, $CH_5N$, $CH_6N_2$, $C_2H_2$, $C_2H_3N$, $C_2H_4$, $C_2H_4S$, $C_2H_5N$, $C_2H_6S$, $C_2H_6S_2$, $C_3H_6S$, $SiH_4$, $B_2H_6$, $Si_2H_6$, $SiH_2Cl_2$, and $PH_3$.

Hydrogen-generating CRISP techniques using catalyzing-reactant combinations such as $SiH_4/F_2$, $B_2H_6/F_2$, or $PH_3/F_2$ are also useful for removing residual oxygen, nitrogen, carbon, tin, lead, aluminum, sulfur, selenium, and other elements that have volatile hydrides from a surface of a semiconductor. Silicon native oxide films are effectively removed by, for example, $PH_3/F_2$ CRISP at high $PH_3$:$F_2$ ratios to generate volatile $PF_3O$, $SiF_4$, $H_2O$, and $SiH_4$, which efficiently remove the native oxide. $SiH_4/F_2$ CRISP is milder and is used to remove residual oxygen, nitrogen, carbon, tin, aluminum, sulfur, selenium, and other elements that have volatile hydrides. When controlled at a high $SiH_4/F_2$ ratio, this CRISP is capable of cleaning and smoothing silicon surfaces and terminating these surfaces with hydrogen.

Metallic surfaces, such as Fe—Ni or Fe—Co magnetic alloys, Ta, $TaN_x$, W, $WN_x$, Cu, Ti, and TiN, are cleaned to remove native oxides by exposure to $PH_3/F_2$ CRISP or other hydride/fluoride CRISP recipes.

Precise control over the coverage of reactive adsorbates and the ability to produce and control different types of reactive adsorbates make CRISP an ideal tool for surface activation. Surfaces of metals, semiconductors, oxides, nitrides, sulfides, and others are terminated with OH, NH, $NH_2$, SH, SeH, AsH, and other fragments, and combinations of these terminations at well-controlled surface concentrations are tailored by using CRISP. For example, in an exemplary embodiment, silicon surfaces are terminated by a combination of H, OH, NH, and $NH_2$ by conducting a CRISP stage with catalyzing reactants $SiH_4$, $F_2O$, and $NF_3$. Alternatively, a CRISP method utilizing catalyzing reactants $SiH_4$, $SiCl_4$, and $NF_3$ is useful for generating a substrate surface comprising H, Cl, NH, and $NH_2$ surface species, of which the surface chlorine atoms are typically subsequently converted to OH species upon short exposure of the surface to $H_2O$. In another exemplary method including CRISP, magnetic alloy surfaces, such as Ni—Fe, are terminated with H, NH, and $NH_2$ using catalyzing reactants $B_2H_6$ and $NF_3$ in a CRISP technique that avoids exposing these sensitive alloys to oxidizing conditions. Similar to the approach described above with reference to FIG. 1, magnetic alloy surfaces are optionally protected by an ultrathin nitride film prior to the deposition of oxide dielectric to provide an oxide-free interface.

A dry etching method including a CRISP method includes introducing a plurality of catalyzing reactants into a reaction chamber containing a substrate, in which the catalyzing reactants react in a continuous and non-saturating catalyzing reaction that generates a volatile by-product and an intermediate reactive molecular fragment. In another aspect, in a dry etching method, the intermediate reactive molecular fragment reacts with the substrate in a fragment-substrate reaction that generates a volatile molecular species, thereby etching the substrate. A dry etching method including CRISP further includes controlling substrate temperature to control the etching. A further embodiment includes applying an energy-containing beam to the substrate to facilitate anisotropic etching, the energy-containing beam being selected from a group including an ion beam and an atomic beam. In one aspect, the intermediate reactive molecular fragment in an etching method comprises atomic hydrogen. In other embodiments, the catalyzing reaction generates a plurality of intermediate reactive molecular fragments. In still another aspect, the intermediate reactive molecular fragments comprise hydrogen atoms and molecular fragments selected from a group including Cl, Br, I, OH, NH, $NH_2$, SH, SeH, AsH, and $AsH_2$. In another aspect, a dry etching method further includes controlling a flow rate ratio of the catalyzing reactants into the reaction chamber to control relative surface concentrations of the hydrogen atoms and the molecular fragments. In another aspect, a plurality of catalyzing reactants include a first type of catalyzing reactant selected from a group including $O_3$, $F_2$, $NF_3$, $ClF_3$, HF, $F_2O$, FI, FNO, $N_2F_2$, $F_2O_2$, and $F_4N_2$, and a second type of catalyzing reactant selected from a group including $CH_4$, CN, $C_2H_8N_2$, $CH_5N$, $CH_6N_2$, $C_2H_2$, $C_2H_3N$, $C_2H_4$, $C_2H_4S$, $C_2H_5N$, $C_2H_6S$, $C_2H_6S_2$, $C_3H_6S$, $SiH_4$, $B_2H_6$, $Si_2H_6$, $SiH_2Cl_2$, and $PH_3$. In certain embodiments, a dry etching method including CRISP is conducted to etch a solid deposit from the internal surfaces of a chemical processing apparatus.

In other embodiments of a dry etching from a process using CRISP, the substrate being etched comprises a solid chemical source of a chemical process system. In a common embodiment, the solid chemical source is a metallic target located in a chemical source chamber upstream from an ALD deposition chamber. In one aspect, varying a flow rate of at least one catalyzing reactant into the chemical source chamber causes the catalyzing reaction to proceed during a chemical delivery time, and the catalyzing reaction substantially ceases during a non-delivery time. In another aspect, the catalyzing reaction generates the intermediate reactive molecular fragment during the chemical delivery time, and the intermediate reactive molecular fragment reacts with the metallic target to generate the volatile molecular species during the chemical delivery time. In another aspect, controlling a temperature of the metallic target effects fast volatilization of the volatile molecular species during the chemical delivery time, thereby generating pulse delivery of the volatile molecular species. In still another aspect, the volatile molecular species comprises a metal.

CRISP is also useful for in-situ cleaning of deposition chambers and other apparatus surfaces, for example, by removing a chemical deposit, such as an $Al_2O_3$ or AlN film. Suitable in-situ cleaning procedures did not exist in the prior art. Generally, such a method includes introducing a gas mixture of catalyzing reactants, including a combination selected from a group including hydride/fluoride, hydride/fluoride/ozone/hydrocarbons, $PH_3/F_2$, $PH_3/F_2/O_3/C_2H_2$, $PH_3/FCl$, and $PH_3/FCl/O_3/C_2H_2$, and further comprises a source of chlorine selected from a group including $SCl_2$, $S_2Cl_2$, $ClF_3$, ClF, ClI, and $SiCl_4$. In a certain embodiment in accordance with the invention, hydrogen-generating CRISP effects in-situ cleaning of $Al_2O_3$ and AlN by volatilizing aluminum as $AlH_3$, and by volatilizing oxygen as $H_2O$ or $PF_3O$. One of ordinary skill in the art recognizes that there are numerous combinations of catalyzing reactants for achieving desired volatilization in a CRISP stage. In an exemplary embodiment, fluorine is a catalyzing reactant, and a catalyzing reactant mixture such as $PH_3/F_2$ or $PH_3/F_2/O_3/C_2H_2$ generates ample amount of adsorbed hydrogen and a highly-driven surface reaction that volatilizes oxygen as $PF_3O$ or $CO_2$. Exemplary fluorine-based reactions are represented in Equations 18-21, below. Equation 18 represents an embodiment of a process for etching $Al_2O_3$ in accordance with the invention in which the volatile Al species is $AlH_3$:

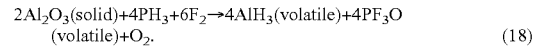
$$2Al_2O_3(solid)+4PH_3+6F_2 \rightarrow 4AlH_3(volatile)+4PF_3O \\ (volatile)+O_2. \qquad (18)$$

Equation 19 represents an example of etching $Al_2O_3$ in which the volatile Al species is $AlCl_2H$:

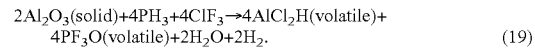
$$2Al_2O_3(solid)+4PH_3+4ClF_3 \rightarrow 4AlCl_2H(volatile)+ \\ 4PF_3O(volatile)+2H_2O+2H_2. \qquad (19)$$

Equation 20 represents an additional process for etching $Al_2O_3$ in which the volatile Al species is $AlH_3$:

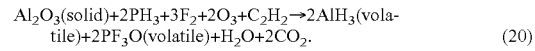
$$Al_2O_3(solid)+2PH_3+3F_2+2O_3+C_2H_2 \rightarrow 2AlH_3(vola\text{-} \\ tile)+2PF_3O(volatile)+H_2O+2CO_2. \qquad (20)$$

Equation 21 represents an example of etching AlN in accordance with the invention in which the Al volatile species is $AlH_3$:

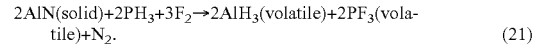
$$2AlN(solid)+2PH_3+3F_2 \rightarrow 2AlH_3(volatile)+2PF_3(vola\text{-} \\ tile)+N_2. \qquad (21)$$

Chlorine is also useful as one of the catalyzing reactants in a CRISP in-situ cleaning procedure. In such embodiments, a chlorine containing species generally improves chamber cleaning efficiency by providing a path for $AlCl_3$ and $AlCl_pH_q$ volatilization.

Figure 8:
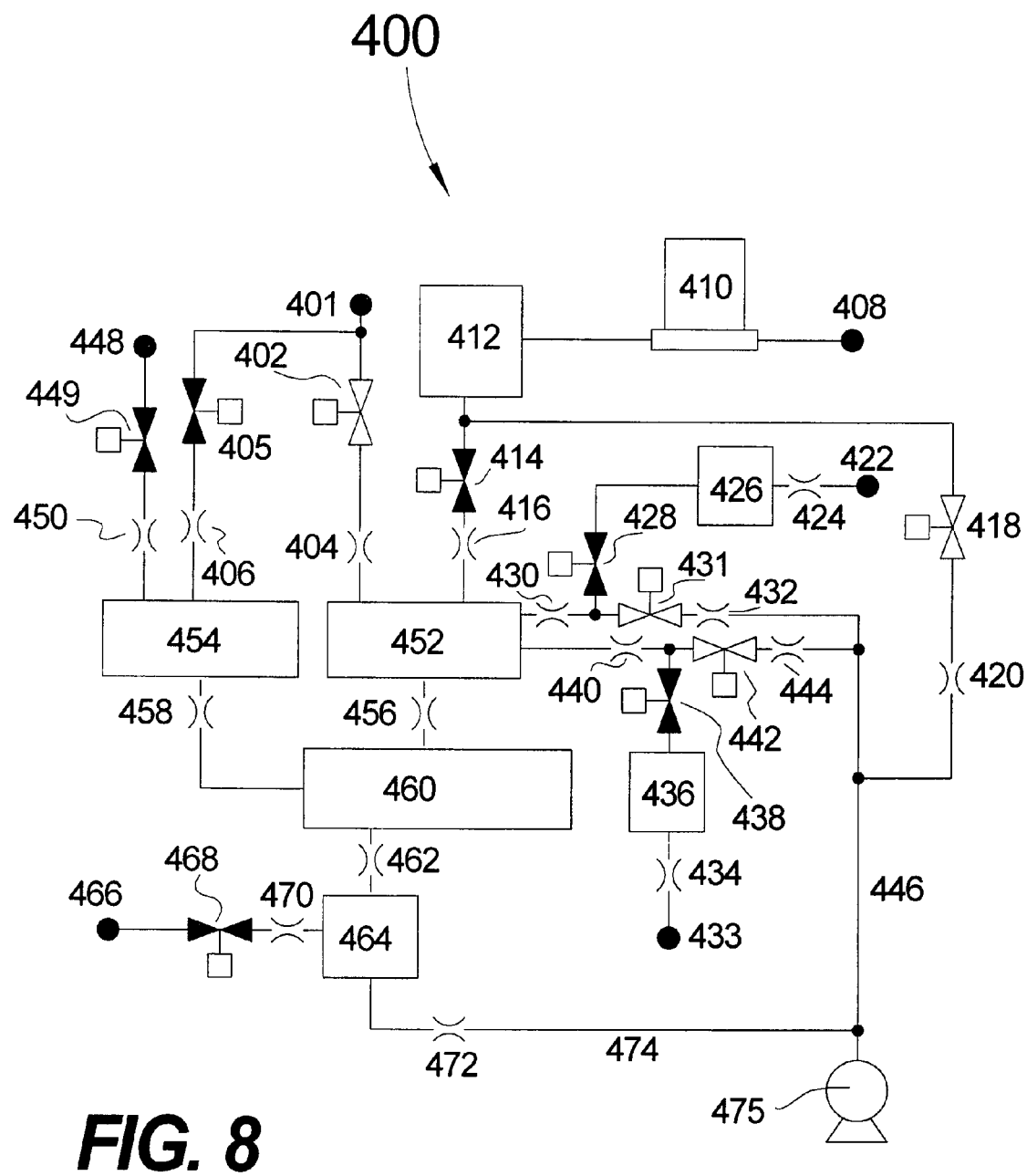
FIG. 8 contains a schematic diagram of a CRISP SMFD ALD apparatus in accordance with the invention.

An apparatus and a method for conducting ALD using Synchronically Modulated Flow Draw (SMFD) is described in co-owned and copending U.S. patent application Ser. No. 10/347,575, filed Jan. 17, 2003, which is incorporated by reference. An SMFD apparatus enables ALD chemical dosage and introduction of CRISP catalyzing reactants at preferred high pressure and low flow, and ALD purge at preferred low pressure and high flow. A schematic diagram of an SMFD apparatus 400 suitable for practicing ALD including a CRISP stage in accordance with the invention is depicted in FIG. 8. Apparatus 400 is fed by a pressure-stabilized inert gas at source 401. This pressurized gas is distributed to the apparatus through flow restriction elements (FRE) that provide pressure step-down when gas is flowing through them. Inert gas is supplied through valve 402 and FRE 404 into showerhead (gas distribution chamber) 452. In addition, chemicals in the form of chemical gas, vapor from liquid or solid chemicals, or mixtures of vapor or gas chemicals with inert gas are maintained at well-controlled pressure at chemical inlet sources, for example, source 422. The pressurized chemical source 422 is connected to a booster container 426 through FRE 424. Booster container 426 is connected through valve 428 and FRE 430 to showerhead 452. Valve 431 provides a path through FRE 432 into a vacuum line to facilitate fast and efficient showerhead purge. Other metal precursor sources similar to sources 422-432 optionally are similarly connected to showerhead zone 452. Oxygen pressurized source 408 is connected through mass flow controller (MFC) 410 into ozone generator 412. Preferably, nitrogen gas is also connected to ozone generator 412 to improve ozone conversion efficiency, as is known in the art. Ozone is fed into showerhead (gas distribution chamber) 452 through valve 414 and FRE 416. Alternatively, ozone is routed into a vacuum line through valve 418 and FRE 420. Preferably, the FREs are set to provide similar flow restriction in both paths to suppress the need for MFC response upon switching the flow between the 414-416 paths and the 418-420 paths.

Catalyzing reactant in the form of gas, vapor from liquid or solid, or mixtures of reactant vapor or gas with or without inert gas are maintained at well-controlled pressure at catalyzing reactant sources, for example, source 433. The pressurized chemical source 433 is connected into a booster container 436 through FRE 434. Booster container 436 is connected through valve 438 and FRE 440 to showerhead 452. Valve 442 provides a path through FRE 444 into a vacuum line to facilitate fast and efficient showerhead purge. Accordingly, the manifold formed by elements 433-444 represents a catalyzing reactant supply system for slow flow delivery of catalyzing reactant, such as fluorine-containing $NF_3$, $F_2$, or $ClF_3$ molecules as used in the $B_2H_6/F_2$ CRISP. This source may be substituted with a high flow supply system, such as manifold 448-450.

The second zone 454 of the showerhead (gas distribution chamber 454) is fed with inert gas through valve 405 and FRE 406. In addition, catalyzing reactant is introduced from a pressurized source 448 through valve 449 and FRE 450. Manifold 448-450 represents a delivery line for high flow of catalyzing reactant such as $CH_4$ or $C_2H_8N_2$ in the $O_3$/hydrocarbon CRISP method. For low flow of chemicals, such as $SiH_4$ or $B_2H_6$, this manifold is replaced with a low flow manifold similar to manifold 433-444.

The exemplary CRISP method 250 for growing ZnS discussed with reference to FIG. 5 requires three low-flow manifolds, such as the manifold formed by elements 433-444, connected to first showerhead zone 452, for the delivery of $ClF_3$, $F_2$, and $F_2O$. Additionally, three low-flow manifolds (of the type described above) are connected to second showerhead zone (gas distribution chamber) 454 to effect delivery of $SiH_4$, $SiCl_4$, and $H_2S$. Showerhead zone 454 is supplied with inert gas through valve 405 and FRE 406. This inert gas manifold is designed to provide a low flow of inert gas out of showerhead zone 454 when CRISP is not being used. For example, during dosage of metal precursor using manifold 422-432, this low flow of inert gas protects showerhead zone 454 from backflow of metal precursor with minimal dilution of the metal precursor. For this reason, showerhead 454 preferably comprises an array of high aspect ratio nozzles suitable for controlling low levels of gas flow.

Showerhead 452 is separated from the ALD reaction chamber 460 by a nozzle array (gas-distribution FRE) 456 that provides for restricted and uniform flow from 452 to reaction chamber 460. Similarly, showerhead 454 is separated from the ALD reaction chamber 460 by a nozzle array (gas-distribution FRE) 458 that provides for restricted and uniform flow from showerhead 454 to reaction chamber 460. The ALD volume is connected to draw control chamber 464 through reaction-chamber FRE 462. Draw control chamber 464 is connected to vacuum pump 475 through draw-control FRE 472. Draw control chamber 464 can be fed with (typically inert) gas directly through line 466, draw-source shut-off valve 468, and draw-source-FRE 470.

Figure 11:
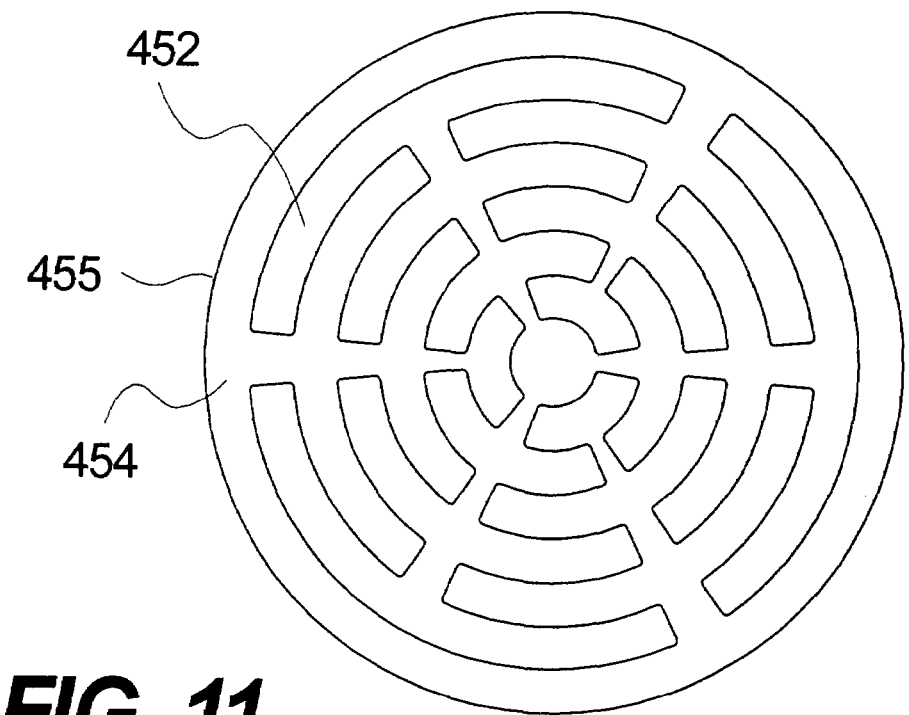
FIG. 11 depicts a schematic top view of a dual-zone showerhead-design gas distribution device.

Preferably, CRISP is implemented using multiple gas distribution chambers. A typical dual-zone showerhead arrangement is depicted schematically in FIG. 8. Because the two showerhead zones 452 and 454 function separately, the showerhead zones are indicated schematically by separate boxes. In other words, because of their separate functionality, each zone can be conceptualized as a separate showerhead. Nevertheless, it is understood that both zones discharge into the same volume and are preferably incorporated in an integrated unit 455, as shown in FIG. 11 and discussed below. When a method comprising CRISP in accordance with the invention is conducted using high flow rates of chemical reactants, it is generally unnecessary to supply inert gas into draw control chamber 464. Table 1 presents the valve positions, open or closed, of the shut-off valves of apparatus 400, as depicted in FIG. 8, during the four typical stages of an ALD method comprising a CRISP stage in accordance with the invention. For example, ALD process 100 described above with reference to FIG. 1 for depositing $Al_2O_3$ by ALD using CRISP is implemented by switching valve during the four static modes of Table 1.

TABLE 1

| Valve | $ML_x$ dose | Purge | CRISP | Deactivation |
|---|---|---|---|---|
| 402 | CLOSE | OPEN | CLOSE | CLOSE |
| 468 | OPEN | CLOSE | CLOSE | CLOSE |
| 428 | OPEN | CLOSE | CLOSE | CLOSE |
| 431 | CLOSE | OPEN | CLOSE | CLOSE |
| 414 | CLOSE | CLOSE | OPEN | CLOSE |
| 418 | OPEN | OPEN | CLOSE | OPEN |
| 405 | OPEN | CLOSE | CLOSE | CLOSE |
| 449 | CLOSE | CLOSE | OPEN | OPEN |

Figure 9:
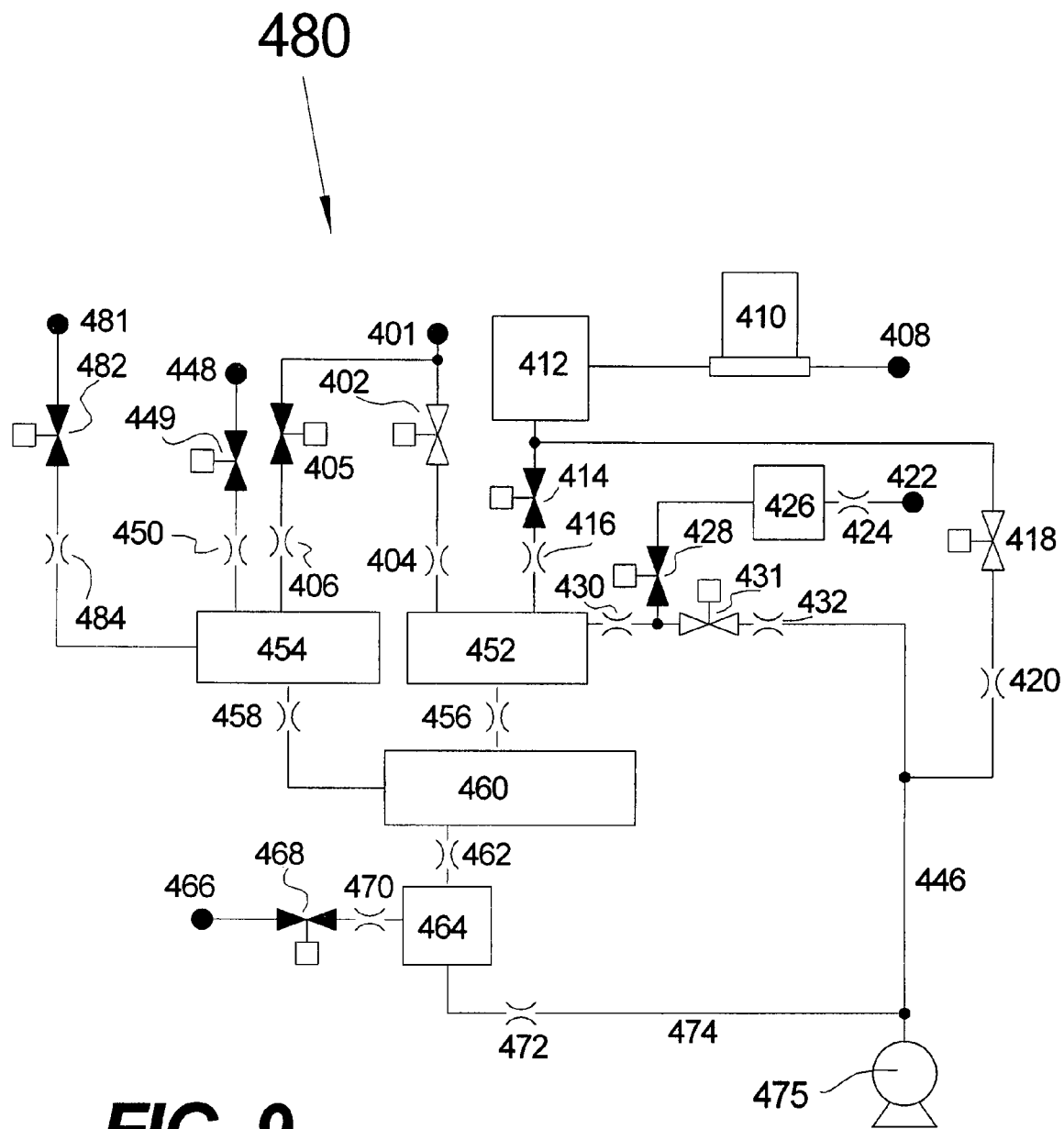
FIG. 9 contains a schematic diagram of a CRISP SMFD ALD apparatus in accordance with the invention for low temperature deposition of an $AlN/Al_2O_3$ film stack over a moisture- and oxygen-sensitive substrate.

For growing a protective AlN layer, as in method 100 of FIG. 1, an additional manifold 481-484, similar to 448-450, is connected to showerhead (gas distribution chamber) 454, as depicted in FIG. 9 showing ALD apparatus 480. AlN growth is effected with manifold 481-484 according to the sequence valve switching in Table 1, but with valve 482 actuating instead of valve 449.

Operation of an SMFD apparatus as described herein is controllable for independent selection of desired pressure and flow rates at each mode, while completely suppressing backflow and back-diffusion, and providing smooth transitions between the modes. Pressure 401 and FREs 404, 456, 462, and 472 are set to deliver purge-gas flow rate, $Q_{purge}$, and maintain showerhead pressure, $P_{purge}^{SH}$, and ALD reaction chamber pressure, $P_{460}^{purge}$, during a purge stage. During dosage of a metal precursor, $ML_x$, FREs 424, 430 are set to deliver chemical to the showerhead at a much smaller flow rate, $Q_{CD}$. This lower flow is accompanied by lower showerhead pressure, $P_{CD}^{SH}$. Inert gas is supplied to draw control chamber 464 through draw-source FRE 470. The direct flow of draw gas into draw control chamber 464 raises the pressure in draw control chamber 464. The increased pressure at draw control chamber 464 reduces the "draw" of gas from ALD reaction chamber 460 to draw control chamber 464. This reduced flow out of reaction chamber 460 is optionally used for smoothly increasing the pressure in reaction chamber 460 during chemical dosage $P_{460}^{CD}$ to provide higher chemical exposures.

In addition to four static modes, preferably a significant transient mode is designed into the initial stage of chemical dosage. The transient is driven by chemical flow from booster volume 426. Given time to equilibrate when valve 428 is closed, the pressure at 426 is similar (almost equal) to the pressure at 422, $P_{426}^{static} \approx P_{422}$. When valve 428 is open, under steady-state conditions, the steady-state pressure at 426, $P_{426}^{SS}$, is smaller than $P_{422}$ due to the pressure gradient over FRE 424. When valve 428 is actuated to open, the pressure at booster volume 426 transients from $\sim P_{422}$ down to the steady-state pressure, $P_{426}^{SS}$. The flow from the chemical sources into showerhead 452 is determined by the pressure at 426 and the conductance of FRE 430. Pressure transient at 426 induces pressure transient at 452. As a result, during the pressure transient in booster volume 426, the flow into the chamber follows a down transient. Concurrently, gas is introduced or flowed into draw control chamber 464 causing a pressure increase in draw control chamber 464 that follows a transient up. Transient time is determined by the volume of 464 and the conductance of FRE 470. During the pressure transient in 464, the flow out of chamber 460 follows a transient down. Adjusting FRE 424, 430 and 470 and the volumes of 426 and 464 enables matching of chamber 460 flow-in transient and flow-out (draw) transients to minimize chamber pressure-excursions. As detailed in U.S. patent application Ser. No. 10/347,575, filed Jan. 17, 2003, chamber pressure excursions are internally smoothed by the SMFD apparatus even when transient time constants and various valve actuations are not perfectly matched and synchronized.

During the transient, showerhead 452 and reaction chamber 460 are loaded with chemical. Initial chemical flow is typically adjusted to match the inert gas flow during purge mode. Accordingly, continuity of flow is preserved. The showerhead and reaction chamber are quickly loaded with chemical under high flow that is characterized with the short residence time associated with the high flow. Transient time and gas throughput are typically adjusted to complete the transient over approximately one to two chamber residence times. Steady-state flow rates during a chemical dosage stage and during a CRISP stage are typically 10 to 500 times smaller than the flow rate at purge mode. Accordingly, the built-in transient serves to significantly reduce chemical dosage response time. This reduced response time is crucial for efficient and high throughput ALD.

Figure 10:
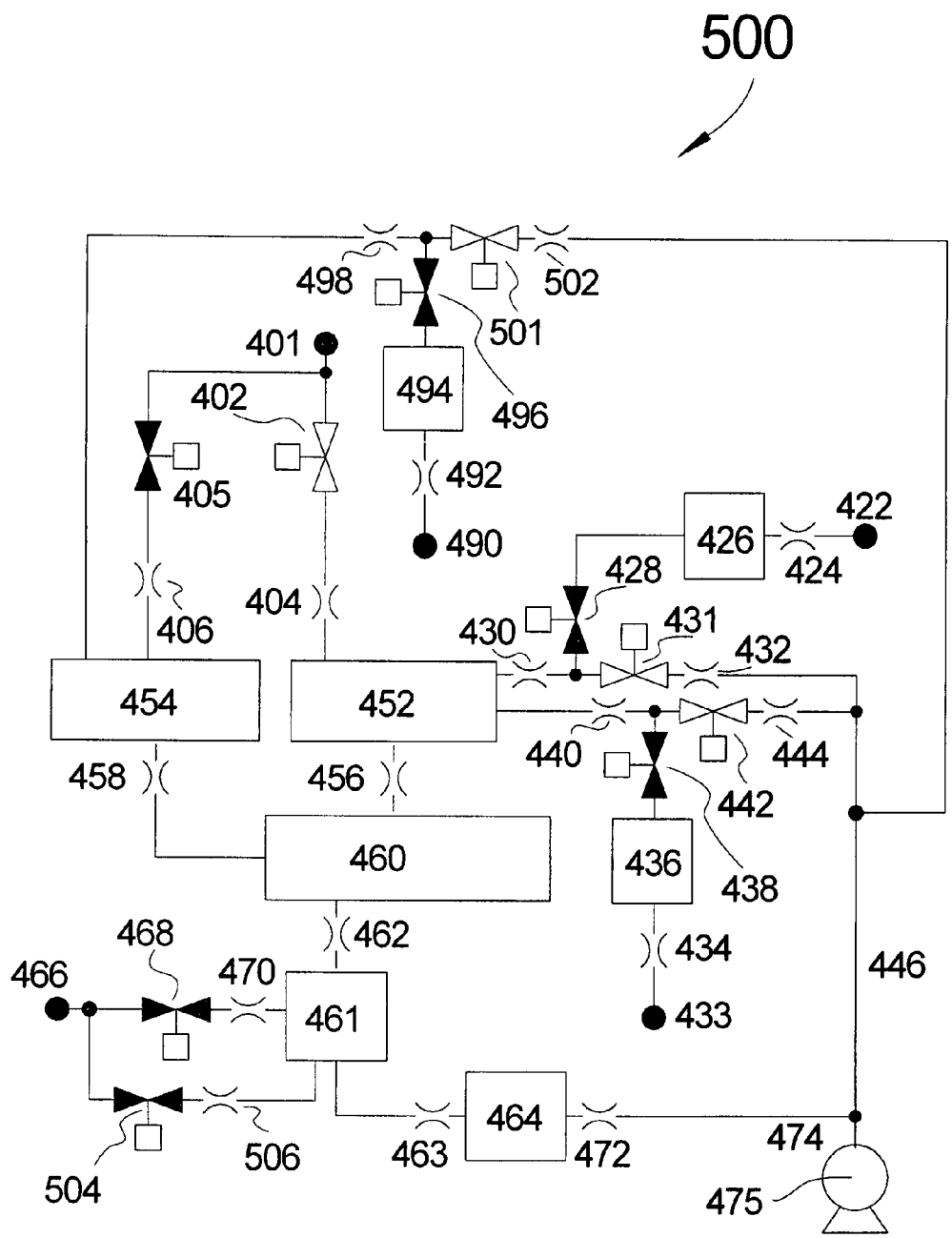
FIG. 10 contains a schematic diagram of a CRISP SMFD ALD apparatus in accordance with the invention for a metal hydride/fluoride-type CRISP ALD.

Other embodiments of SMFD including implementation of a draw gas introduction chamber ("DGIC") and a draw gas plenum system are described in detail in U.S. patent application Ser. No. 10/347,575, filed Jan. 17, 2003. An ALD apparatus 500 in accordance with the invention comprising a DGIC 461 is depicted in FIG. 10. DGIC 461 is proximate to reaction chamber 460 and is separated from chamber 460 through reaction-chamber FRE 462. DGIC 461 is fluidly connected to draw control chamber 464 through DGIC-FRE 463. A DGIC 461 is utilized to inhibit diffusion of chemicals back into reaction chamber 460 from locations downstream of chamber 460, especially when the volume of draw control chamber 464 is relatively large. In apparatus 500, draw control gas is introduced into DGIC 461, which has a small volume, rather than into draw control chamber 464. Since the volume of DGIC 461 is small, the flow of draw control gas through DGIC 461 into draw control chamber 464 effectively prevents diffusion of chemicals towards reaction chamber 460.

When a system 400, 450, 500 is switched from chemical dose mode to purge mode, the transients are much less important. The small volume of showerhead 452 is quickly loaded to $P_{purge}^{SH}$ through the relatively high conductance of FRE 404. Draw control chamber 464 pressure drop is fast due to the high conductance of draw-control FRE 472. There is also no reason to artificially produce transients such as in the case of the leading edge of the chemical dose mode. Accordingly, transient effects associated with OFF actuation of the chemical dose are rather minor.

The SMFD ALD apparatus overcomes the tradeoff between the need for high flow (and low pressure) during purge (to enable efficient and short time purge), and the need for low flow (and high pressure) during chemical dose (to enable fast reaction and high chemical utilization). If a steady pressure is desired throughout the process, the apparatus is able to maintain practically constant process pressure while the flow rates are modulated by more than a factor of ten. Alternatively, both pressure and flow can be modulated in order to gain even higher efficiencies for purge and chemical dose steps without any tradeoff effects. SMFD apparati and methods achieve this desired capability by modulating the draw (flow out of the ALD compartment) in synchronization with the modulation of flow into the ALD compartment. Other advantages of SMFD ALD techniques are summarized in U.S. patent application Ser. No. 10/347,575, filed Jan. 17, 2003.

Flow rates during CRISP are adapted to the nature of the catalyzing reactants. For example, $O_3$ finite lifetime dictates relatively high flow rates that are necessary to compensate for $O_3$ decay. Accordingly, chemical delivery manifolds, such as the manifold formed by elements 408-420 in FIGS. 8 and 9, are utilized. Ozone delivery manifold 408-420 also accommodates the preferred continuous flow mode of commercial ozone generators. $O_2$ is continuously supplied to the ozone generator 412 through an MFC 410 and the flow of $O_2/O_3$ out of the ozone generator flows continuously either to showerhead zone 452 through valve 414 and FRE 416 or to a vacuum line 446 through valve 418 and FRE 420. One or more additional catalyzing reactants, for example $CH_4$, are supplied at high flow from showerhead zone 454. When CRISP is performed at high flow, using the apparatus shown in FIG. 9 configured as described in Table 1, there is no need to supply inert gas into draw control chamber 464. Nevertheless, in certain embodiments, the flow necessary during high flow CRISP is smaller than the flow during purge, and the pressure in draw control chamber 464 is raised by flowing draw control gas into 464. Frequently, the desired pressure in draw control chamber 464 during CRISP is different than the pressure desired during non-CRISP chemical dosage to reduce the flow during chemical dosage. To accommodate different pressures in draw control chamber 464, gas pressure from 466 is routed through a second draw control gas manifold as depicted in FIG. 10, and a second shut-off valve 504 and a second draw-source FRE 506 are disposed in fluid communication between draw control gas source 466 and DGIC 461, in parallel to manifold 468-470.

CRISP using stable molecules, such as in the $SH_4/NF_3$ process, is typically utilized with low flow to reduce utilization of chemical and expensive abatement. While high pressures are usually not necessary due to the high efficiency of CRISP, slow flow is implemented by increasing the pressure in draw control chamber 464. A catalyzing fluorine-containing reactant is delivered through manifold 433-444 with a high flow leading edge and a slow steady-state flow. Similarly, manifold, 490-502 is implemented to deliver catalyzing reactant, for example, SiH$_4$, into showerhead zone 454. The exemplary ALD process modes of apparatus 500 of FIG. 10 are entered in Table 2, in which "O" signifies open, and "C" signifies closed.

TABLE 2

| Mode/Valve | 402 | 468 | 504 | 428 | 431 | 438 | 442 | 496 | 500 | 405 |
|---|---|---|---|---|---|---|---|---|---|---|
| ML$_x$ dose | C | O | C | O | C | C | C | C | O | O |
| Purge | O | C | C | C | O | C | O | C | C | C |
| CRISP | C | C | O | C | C | O | C | O | C | C |
| Deactivation | C | C | O | C | C | C | C | O | C | C |

Figure 12:
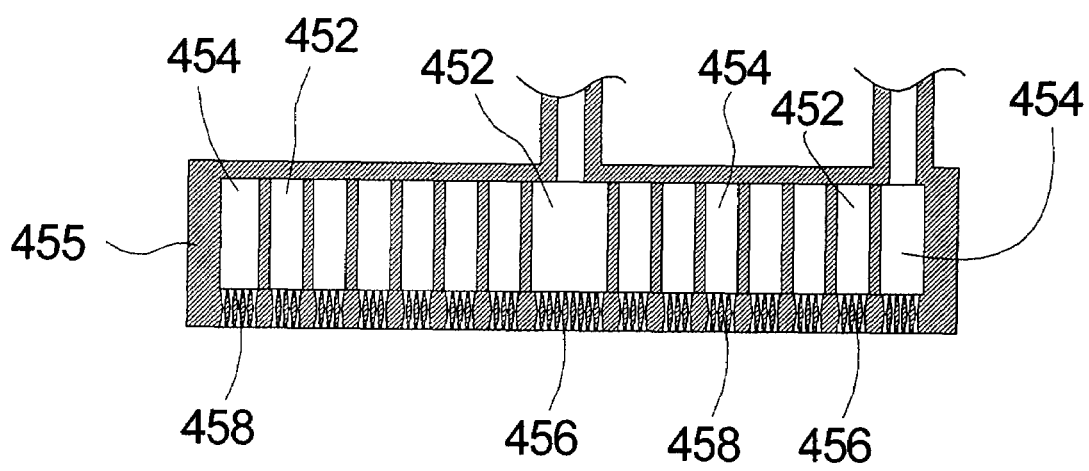
FIG. 12 depicts a schematic sectional view of the dual-zone showerhead-design gas distribution device of FIG. 11.

Dual showerhead designs are common in the art of CVD, in which separated delivery of reactive chemicals is sometimes important, and many suitable designs have been used. Preferably, CRISP dual showerhead designs include small effective volumes and high aspect-ratio nozzles that are best suited for SMFD applications, as described in U.S. patent application Ser. No. 10/347,575, filed Jan. 17, 2003. A suitable design is depicted in schematic form in FIGS. 11 and 12. FIGS. 11 and 12 illustrate schematically the division of a centrosymmetric showerhead 455 into two separate chambers 452 and 454. FIG. 12 depicts the gas feed lines corresponding to FREs 404, 406 and respective outlet nozzles corresponding to FREs 456, 458.

At low temperatures, certain metal precursor reactions require high exposure to reach saturation within a practical and cost-effective stage time of 50 msec to 250 msec. An SMFD ALD apparatus and a corresponding method enable high exposures of precursors without trade-offs of purge performance and are, therefore, well suited for methods using low process-temperature. Nevertheless, increased material utilization often associated with chemical dosage at high pressure often cause undesired deposits of solid films in an ALD apparatus. As described in detail in U.S. patent application Ser. No. 10/347,575, filed Jan. 17, 2003, the design of an SMFD apparatus lends itself to an integrated abatement system. The integrated abatement is based on efficient conversion of ALD metal precursors into a solid deposit on a specially designed insert. Integrated abatement efficiency and maintenance schedules are enhanced by the inherent low material usage of SMFD ALD methods. Nevertheless, when low temperature ALD dictates increased usage of ALD metal precursor, a preferred design reduces undesired deposition of chemicals on apparatus surfaces.

Figure 13:
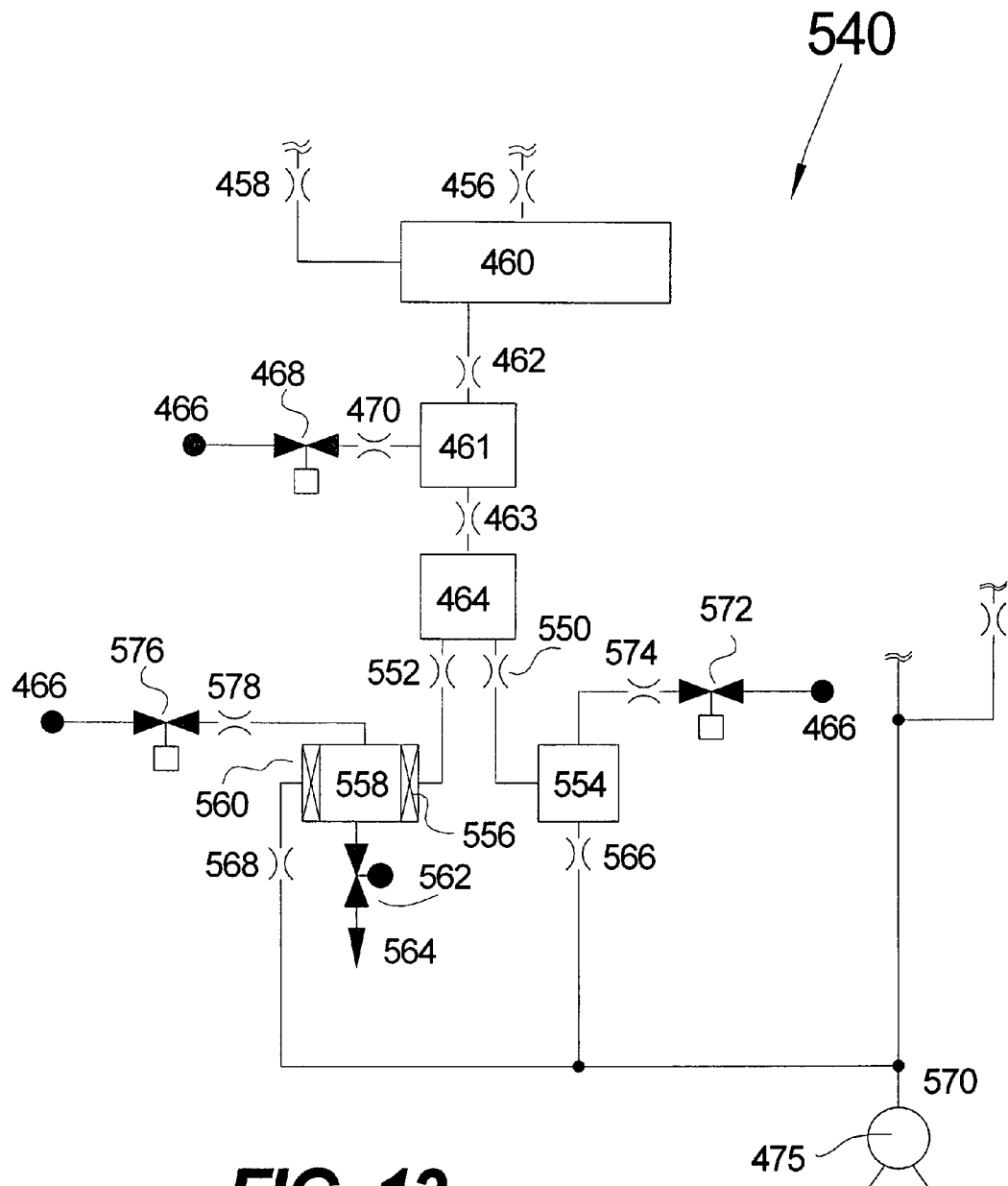
FIG. 13 contains a schematic diagram of a CRISP SMFD ALD apparatus in accordance with the invention with a split downstream and downstream metal-precursor entrapment.

FIG. 13 depicts schematically an apparatus 540 for conducting a method in accordance with the invention including a high level of metal precursors. For descriptive purposes, a low-temperature ALD method including a metal-precursor dosage stage and a CRISP stage using a catalyzing reactant mixture O$_3$/CH$_4$ is discussed. For the sake of clarity, parts of the apparatus upstream from ALD reaction chamber 460 are not shown in FIG. 13. Apparatus 540 includes ALD reaction chamber 460, DGIC 461, and draw control chamber 464. Draw control chamber 464 is connected to after-draw control chamber 554 through FRE 550, and to after-draw control chamber 558 through FRE 552 and high conductance valve 556. After-draw control chamber 554 is connected to a vacuum pump 570 through after-draw FRE 566. After-draw control chamber 558 is connected to a vacuum pump through a high conductance valve 560 and after-draw FRE 568. After-draw control chamber 554 is fed with (typically inert) gas through valve 572 and FRE 574. After-draw control chamber 558 is fed with (typically inert) gas through valve 576 and FRE 578. After-draw control chambers 554 and 558 may also be connected to different vacuum pumps (not shown). Synchronous flow-draw modulation is performed utilizing draw-control chamber 464 in accordance with the teaching of U.S. patent application Ser. No. 10/347,575, filed Jan. 17, 2003. The pressure in chambers 554 or 558 is raised selectively by flowing after-draw gas through valve 572 and FRE 574, and valve 576 and FRE 578, respectively, into these chambers to suppress flow from 464. Accordingly, the major portion of the flow can be selectively directed to either 554 or 558. After-draw control chamber 558 includes a cooled high surface-area insert element. Concurrent with metal precursor dosage and purge, flow out of draw control chamber 464 is diverted into after-draw control chamber 558, where the excess of metal precursor is condensed and removed from the effluent. This functionality is achieved by flowing after-control gas into after-draw control chamber 554, therefore raising the pressure in 554 and diverting most of the flow into 558.

Metal precursor collection in after-draw control chamber 558 is conducted during chemical dosage and chemical purge. During the CRISP stage, the chemicals are diverted mainly into after-draw control chamber 554 by flowing after-draw control gas into after-draw control chamber 558. After-draw control chamber 554 typically includes an integrated abatement system as described in a U.S. patent application Ser. No. 10/347,575, filed Jan. 17, 2003. Integrated abatement elements are useful for eliminating trace amounts of metal precursors that enter 554. Trace amounts of CRISP chemicals also enter after-draw control chamber 558. Nevertheless, the temperature of the condensation element in 558 is commonly set to condense effectively the metal precursor, while allowing the gaseous catalyzing reactants to pass through. In addition, an optional ozone-quenching element upstream of after-draw control chamber 558 further suppresses possible reaction inside after-draw control chamber 558. For optimized performance, the volume of draw control chamber 464 is kept at a minimum, as described in U.S. patent application Ser. No. 10/347,575, filed Jan. 17, 2003. In addition, the walls of draw control chamber 464 are lined with heatable metal sheets that can be removed for easy maintenance since some growth of film, mostly by ALD mode, occurs on the liners.

An exemplary ALD process for deposition of Al$_2$O$_3$ using Al(CH$_3$)$_3$ metal precursor and a CRISP catalyzing reactant mixture O$_3$/CH$_4$ conducted at temperatures below 100° C. is next described. The Al(CH$_3$)$_3$ reaction stage is conducted at a pressure less than under 500 mTorr, using 10 sccm flow. The purge of Al(CH$_3$)$_3$ is performed at 50 mTorr and 500 sccm flow. The CRISP stage is conducted at 200 mTorr pressure using 200 sccm flow. During Al(CH$_3$)$_3$ chemical dosage, a draw control gas flow of 400 sccm into draw control chamber 464 keeps the pressure high in ALD reaction chamber 460, and a flow of 650 sccm into after-draw control chamber 554 diverts most of the effluent coming from draw control chamber 464 into after-draw control chamber 558. During the purge with 500 sccm, the flow of 650 sccm into after-draw control chamber 554 diverts most of the effluent coming from draw control chamber 464 into after-draw control chamber 558. Excess Al(CH$_3$)$_3$ is condensed on the condensation element that is maintained at 0° C. During the CRISP process, a flow of 750 sccm into after-draw control chamber 558 diverts most of the effluent coming from chamber 464 into after-draw control chamber 554.

Condensation/after-draw control chamber 558 is cleaned by a simple procedure. When the metal precursor is gaseous, the procedure includes isolating after-draw control chamber 558 with conductance valves 556 and 560, warming up the condensation element, and collecting the gas through valve 562. When the metal precursor is liquid, valve 562 functions as a liquid draining valve. When the metal precursor is solid at room temperature, valves 556 and 560 are closed, thereby releasing after-draw control chamber 558 from isolation, and the chemical precursor is removed using conventional techniques, such as solvent extraction. The precursor is collected and recycled (after an appropriate purification) when economically and environmentally feasible. Alternatively, a low-cost metal precursor is neutralized and disposed according to conventional techniques.

Recently, an SMFD prototype was successfully operated with zero steady-state flow of chemical during dosage. In that embodiment, chemical dosage was accomplished by a fast booster flow to dose the ALD reaction chamber 460 with chemical. Consequentially, the flow of chemical was stopped by shutting the chemical dosage valve 428 while the draw control flow of gas into draw control chamber 464 was maintained. The chemical was effectively trapped for an additional zero-flow dosage period sufficiently long enough for effectively saturating the ALD reaction. This method of operating SMFD is desirable in the case of low temperature ALD in which slower precursor reaction rates are accelerated by dosing chemicals at maximized partial pressure (up to 100% dose) to the point that the ALD space is fully dosed, then maintaining this high chemical pressure without further flow of chemical, for as long as necessary to complete the ALD reaction.

Table 3 summarizes the exemplary ALD cycle. The notation ML$_x$ dose represents the flow of chemical into the ALD space. The notation ML$_x$ hold represents the zero-flow part of the chemical dose.

TABLE 3

| Mode/Valve | 402 | 468 | 504 | 428 | 431 | 438 | 442 | 496 | 500 | 405 |
|---|---|---|---|---|---|---|---|---|---|---|
| ML$_x$ dose | C | O | C | O | C | C | C | C | O | O |
| ML$_x$ hold | C | O | C | C | C | C | C | C | O | O |
| Purge | O | C | C | C | O | C | O | C | C | C |
| CRISP | C | C | O | C | C | O | C | O | C | C |
| Deactivation | C | C | O | C | C | C | C | O | C | C |

Optionally, a metal precursor is pulsed into showerhead zone 452 by liquid injection. For example, a pulsed valve such as the Parker Hannifin GV series 99 mounted on the top of the showerhead is used to meter small droplets of liquids into (heatable) showerhead zone 452 and create a very fast pressure rise. This fast pressure increase in the showerhead creates a fast increase in pressure and flow in the ALD chamber. When accompanied with fast pressure increase in draw control chamber 464, this technique produces significant pressure excursions that provide large chemical exposures within short periods of time and with short delays. This technique is especially useful for delivery of low vapor pressure liquid chemicals. Alternatively, a low vapor pressure solid chemical solvated in a high vapor pressure solvent is metered and evaporated inside the showerhead. Rapid solvent evaporation is achieved throughout the ALD reaction chamber by a delay between the onset of flow (pulsed metered liquid) and draw modulation. Downstream effluent trapping as described above with reference to FIG. 13 is particularly compatible with a pulsed excursion mode of chemical dosage to remove large amounts of chemicals from exhaust effluents without adversely affecting vacuum performance or the environment.

Those skilled in the art appreciate that CRISP methods are useful for improving many different processing techniques. In particular, the ability to generate ample amounts of reactive atoms, molecular species, and molecular fragments on a surface circumvents the difficult, and many times practically impossible, need to deliver unstable reactive atoms and other chemical species to react with a substrate. One prominent problem of the prior art is the difficulty in delivering atomic hydrogen from a remote space into a reaction chamber without detrimental loss due to unavoidable surface and gas phase recombination.

Accordingly, CRISP enables cost-effective improvement of ALD dosage reactions, as discussed above. For example, adsorbed hydrogen is produced by a catalyzing reaction CF↓+DH↓→DF↑+C↑+H(adsorbate). The arrow notations represent reactants (down) and volatile by-products (up). These types of CRISPs circumvent the difficult task of delivering hydrogen atoms from remote locations. Most ALD of elemental metal and semiconductor films is based on a cycle comprising dosage of metal (or semiconductor) precursors, as a first ALD reactant, and hydrogen or strongly reducing chemicals as the second ALD reactant. As explained above, plasma-generated atomic hydrogen is often incompatible with cost-effective ALD. Strongly reducing molecules, such as SiH$_4$, Si$_2$H$_6$, and B$_2$H$_6$, have been unstable in prior-art ALD process temperatures leading to mixed ALD-CVD deposition-mode. In contrast, CRISP methods improve ALD of compound films by replacing the non-metal containing precursors with more reactive CRISPs. For example, a conventional CH reactant is replaced with C and H adsorbates according to the process: CF↓+DH↓→DF↑+C(adsorbate)+H(adsorbate).

CRISP also improves CVD. CVD reactions are enhanced by the replacement of conventional CVD reactants with CRISP equivalents. For example, H$_2$ molecules that are used to reduce WF$_6$ in the W CVD process are substituted with CRISP-generated hydrogen adsorbates to enhance the deposition rate and/or reduce process temperature and to improve film quality (by, for example, reducing fluorine levels). Similarly, copper CVD from Cu(tfac)$_2$ is enhanced by the substitution of H$_2$ with CRISP-generated adsorbed hydrogen.

A CVD method including a CRISP method in accordance with the invention includes introducing a CVD reactant into a reaction chamber containing the substrate, introducing a plurality of catalyzing reactants into the reaction chamber, whereby the catalyzing reactants react in a continuous and non-saturating catalyzing reaction that generates a volatile by-product molecule and an intermediate reactive molecular fragment at a substrate surface, and the intermediate reactive molecular fragment reacts with the CVD reactant in a CVD reaction that deposits a solid film on the surface. Typically, the catalyzing reaction is more than 10 times faster than the CVD reaction. Also, the CVD reaction including the intermediate reactive molecular fragment and the CVD reactant is typically more than 10 times faster than a reaction including the unreacted catalyzing reactants and the CVD reactant. In certain CVD reactions involving CRISP, the intermediate reactive molecular fragment comprises atomic hydrogen. In an example of a CVD CRISP process, the CVD reactant comprises $WF_6$ and the deposited solid film comprises W. In another example, the CVD reactant comprises a copper (II) beta-diketonate complex and the solid film comprises copper. In another example, the copper (II) beta-diketonate complex comprises $Cu(tfac)_2$.

In another aspect of a CVD CRISP process, the catalyzing reaction generates a plurality of intermediate reactive molecular fragments. In another aspect, molecular fragments comprise a hydrogen atom and another molecular fragment selected from a group including OH, NH, $NH_2$, SH, SeH, $AsH$, and $AsH_2$. In another aspect, controlling a flow ratio of the catalyzing reactants serves to control relative surface concentrations of the intermediate reactive molecular fragments, typically hydrogen atoms and other molecular fragments. In an example of a CVD CRISP process, the CVD reactant comprises a copper (II) beta-diketonate complex, the solid film comprises copper, and the molecular fragments comprise OH. In particular embodiments, the copper (II) beta-diketonate complex comprises $Cu(hfac)_2$. In another example, the CVD reactant comprises tetraethoxysilane (TEOS) and the molecular fragment comprises OH. In other examples of CVD CRISP processes, a plurality of catalyzing reactants comprise a first type of catalyzing reactants and a second type of catalyzing reactants, a first-type catalyzing reactant is selected from a group including $O_3$, $F_2$, $NF_3$, $ClF_3$, HF, $F_2O$, FI, FNO, $N_2F_2$, $F_2O_2$, and $F_4N_2$; and a second-type catalyzing reactant is selected from a group including $CH_4$, CN, $C_2H_8N_2$, $CH_5N$, $CH_6N_2$, $C_2H_2$, $C_2H_3N$, $C_2H_4$, $C_2H_4S$, $C_2H_5N$, $C_2H_6S$, $C_2H_6S_2$, $C_3H_6S$, $SiH_4$, $B_2H_6$, $Si_2H_6$, $SiH_2Cl_2$, and $PH_3$.

In another embodiment of a CVD CRISP process, CRISP also improves abatement techniques. A CVD reactant is introduced into an abatement reaction chamber from a chemical reaction chamber and the catalyzing reactants are introduced independently into the abatement reaction chamber, and the catalyzing reaction generates an intermediate reactive molecular fragment that reacts with the CVD reactant to facilitate abatement. In certain embodiments, the abatement is conducted at a temperature not exceeding 150° C. In one example, the CVD reactant comprises TEOS. In another example, the CVD reactant comprises $WF_6$. In still another example, the CVD reactant comprises a copper (II) beta-diketonate. In still another example, the CVD reactant comprises $AlCl_3$. For example, tetraethoxysilane (TEOS, $Si(OC_2O_5)_4$) reacts at subatmospheric pressure (prior to the pump) or atmospheric pressure (pump-exhaust) with CRISP-generated hydrogen and oxygen adsorbates. Copper and tungsten precursors are also effectively abated at lower temperatures by the CVD processes mentioned above.

Etch technology utilizes remotely-generated ion or atomic beams with CRISP-generated reactive adsorbate fragments. For example, aluminum etching is facilitated by CRISP-generated chlorine resulting from a catalyzing reaction involving a $SiCl_4/ClF_3$ mixture, or similar mixture. Alternatively, chlorine is generated in a catalyzing reaction of $CCl_4$ and $O_3$ (volatile $CO_2$ drives the catalyzing reaction). Additional etching species, such as Br and I, are similarly generated in a catalyzing reaction of halocarbon molecules and $O_3$. As described above, CRISP is useful for cleaning oxygen, carbon, and metallic impurities from substrate wafers and from apparatus walls.

CRISP is also useful in film treatments, such as in a process equivalent to a "forming gas anneal". In such a process, CRISP generates a high concentration of atomic and/or activated hydrogen at a surface of a grown film to facilitate more efficient and lower temperature reduction of interface defects. CRISP-generated hydrogen adsorbate thereby replaces conventionally used $H_2$-gas. For example, a clean silicon or compound semiconductor surface is smoothed by providing ample concentration of intermediate reactive molecular-fragment hydrogen at the surface of a mildly annealed substrate to induce step and kink migration and coalescence.

CRISP enables annealing of integrated circuit substrates faster or at a lower temperature than the prior art. The ambient effect is enhanced because CRISP provides more reactive species on the surface of a heated substrate. For example, $H_2O$ in an anneal is replaced by a catalyzing reaction involving an $O_3$/hydrocarbon mixture, which generates molecular hydrogen and oxygen adsorbate fragments in their most reactive form.

CRISP is also useful for providing reactive dopants, such as B or P, on a surface in an atomic adsorbed form. Accordingly, very shallow doped areas may be realized. A relatively simple mask of oxide sufficiently contains the shallow doping into exposed, etched windows.

CRISP is useful for promoting hetero-epitaxial growth of thin strained layers. For example, an exposed silicon area is converted into a Si—Ge thin layer by utilizing CRISP to generate ample concentrations of reactive Ge and H adsorbed on the surface, such as from exposure to $GeH_4$ and $ClF_3$ (or other fluorine containing CRISP reactants) at a relatively high $GeH_4:ClF_3$ ratio to promote generation of adsorbed H, $GeH_pCl_qF_r$, and volatile $GeF_4$ and $SiF_4$. This treatment obtains a very thin layer of epitaxial Si—Ge, for example, in the area of a gate channel.

In another extension of CRISP, CRISP functions as a "point of use" chemical source. For example, ALD and CVD processes are conducted using CRISP processes designed to induce etch processes on a surface of a metallic or compound target. This enables high flow delivery of non-volatile precursors and metastable precursors, as well as the generation of a pure precursor flow when commercially available chemicals are not sufficiently pure. For example, CuCl or $Cu_3Cl_3$ vapors require temperatures in excess of 200° C. to sustain adequate vapor pressure and flow. As a result, in the prior art, chemical delivery is difficult and impractical, especially when fast flow-switching is necessary to conduct ALD. Through CRISP, however, this problem is circumvented. By reacting CRISP catalyzing reactants, such as $SiCl_4$ and $ClF_3$, to react in a fluorine-generating catalyzing reaction in the presence of a metallic Cu-target maintained at high temperature in a reaction space upstream from the deposition chamber, CuCl delivery is obtained. Such CRISP catalyzing reactants are convenient gaseous chemicals, suitable for steady-state delivery and fast switching.

Systems, apparati, and methods designed and operated to use CRISP in accordance with the invention are particularly useful in ALD technology. Catalytic reactions for induced surface process (CRISP) is also useful, however, in a wide variety of circumstances and applications. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the systems, devices, and methods described in the claims below and by their equivalents.

The invention claimed is:

1. A method for cleaning a semiconductor surface comprising exposing said surface to a hydride/fluoride mixture of catalyzing reactants to generate hydrogen adsorbate on the surface to volatilize an atom selected from the group consisting of O, N, C, Sn, and Al from said surface:

wherein said catalyzing reactants react in a catalyzing reaction which consumes said hydride/fluoride mixture of catalyzing reactants;

said catalyzing reaction is continuous and non-saturating;

said catalyzing reaction generates a volatile by-product and an intermediate reactive hydrogen adsorbate on said surface; and said intermediate hydrogen adsorbate reacts with said atom in a fragment-surface reaction.

2. A method as in claim 1 wherein said substrate comprises silicon or germanium and wherein a native oxide or nitride film is removed, and silicon or germanium from said oxide or nitride films is volatilized as $SiH_4$ or $GeH_4$, and said surface is thereby smoothed and becomes terminated with hydrogen.

3. A method as in claim 1 wherein said mixture of catalyzing reactants is selected from the group consisting of $SiH_4/F_2$, $B_2H_6/F_2$, $Si_2H_6/F_2$, $SiH_2Cl_2/F_2$, $PH_3/F_2$, $SiH_4/ClF_3$, $B_2H_6/ClF_3$, $Si_2H_6/ClF_3$, $SiH_2Cl_2/ClF_3$, $PH_3/ClF_3$, $SiH_4/HF$, $B_2H_6/HF$, $Si_2H_6/HF$, $SiH_2Cl_2/HF$, and $PH_3/HF$.

* * * * *